United States Patent
Lee et al.

(10) Patent No.: US 11,914,892 B2
(45) Date of Patent: Feb. 27, 2024

(54) STORAGE DEVICE ADJUSTING HISTORY READ LEVEL STORAGE AREAS BASED ON RELIABILITIES OF MEMORY BLOCKS, STORAGE CONTROLLER, AND OPERATING METHOD OF STORAGE CONTROLLER

(71) Applicant: SAMSUNG ELECTRONICS CO., LTD., Suwon-si (KR)

(72) Inventors: Kwangwoo Lee, Seoul (KR); Sangjin Yoo, Bucheon-si (KR); Yeonji Kim, Seoul (KR); Jeongkeun Park, Suwon-si (KR); Jeongwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 17/742,030

(22) Filed: May 11, 2022

(65) Prior Publication Data
US 2023/0066982 A1  Mar. 2, 2023

(30) Foreign Application Priority Data
Aug. 31, 2021 (KR) ......................... 10-2021-0115702

(51) Int. Cl.
*G06F 3/06* (2006.01)
(52) U.S. Cl.
CPC .......... *G06F 3/0656* (2013.01); *G06F 3/0604* (2013.01); *G06F 3/0679* (2013.01)
(58) Field of Classification Search
CPC ............................. G06F 3/0619; G06F 3/064
See application file for complete search history.

(56) References Cited

U.S. PATENT DOCUMENTS

| 8,467,249 B2 | 6/2013 | Katz et al. |
| 9,535,620 B2 | 1/2017 | Kim et al. |
| 9,632,868 B2 | 4/2017 | Song |
| 9,852,804 B2 | 12/2017 | Park et al. |

(Continued)

FOREIGN PATENT DOCUMENTS

| CN | 113076218 A | 7/2021 |
| KR | 10-2014-0118555 A | 10/2014 |

(Continued)

OTHER PUBLICATIONS

European Search Report, dated Jan. 3, 2023, issued by the European Patent Office, Application No. 22181270.4.

(Continued)

*Primary Examiner* — David Yi
*Assistant Examiner* — Nicholas A. Paperno
(74) *Attorney, Agent, or Firm* — Sughrue Mion, PLLC

(57) ABSTRACT

A storage device includes a non-volatile memory including memory blocks, and a storage controller including a history buffer including plural history read level storage areas corresponding to the memory blocks. The storage controller dynamically adjusts a number of the history read level storage areas allocated to one or more of the plurality of memory blocks based on reliabilities of the memory blocks during runtime of the storage device. The storage controller increases a number of history read level storage areas allocated to a first memory block among the memory blocks that has a relatively low reliability with respect to the reliabilities of remaining ones of the memory blocks.

20 Claims, 32 Drawing Sheets

(56) References Cited

U.S. PATENT DOCUMENTS

| | | |
|---|---|---|
| 10,910,073 B2 | 2/2021 | Kojima |
| 11,107,269 B2 | 8/2021 | Mandal et al. |
| 2015/0085572 A1 | 3/2015 | Subramanian et al. |
| 2016/0147582 A1 | 5/2016 | Karakulak et al. |
| 2018/0342305 A1 | 11/2018 | Cha et al. |
| 2019/0004734 A1 | 1/2019 | Kirshenbaum et al. |
| 2020/0027503 A1 | 1/2020 | Chen et al. |
| 2020/0409580 A1 | 12/2020 | Byun |
| 2021/0166774 A1 | 6/2021 | Cha et al. |

FOREIGN PATENT DOCUMENTS

| | | |
|---|---|---|
| KR | 10-2017-0066084 A | 6/2017 |
| KR | 10-2021-0001501 A | 1/2021 |
| KR | 10-2021-0010633 A | 1/2021 |
| KR | 10-2021-0068894 A | 6/2021 |
| KR | 10-2021-0072685 A | 6/2021 |

OTHER PUBLICATIONS

Communication dated May 16, 2022 by the Korean Intellectual Property Office in counterpart Korean Patent Application No. 10-2021-0115702.

US 11,914,892 B2

STORAGE DEVICE ADJUSTING HISTORY READ LEVEL STORAGE AREAS BASED ON RELIABILITIES OF MEMORY BLOCKS, STORAGE CONTROLLER, AND OPERATING METHOD OF STORAGE CONTROLLER

CROSS-REFERENCE TO RELATED APPLICATION

This application is based on and claims priority under 35 U.S.C. § 119 to Korean Patent Application No. 10-2021-0115702, filed on Aug. 31, 2021, in the Korean Intellectual Property Office, the disclosure of which is incorporated by reference herein in its entirety.

BACKGROUND

The present disclosure relates to a memory device, and more particularly, to a storage controller, a storage device comprising the storage controller, and an operating method of the storage controller.

As a non-volatile memory, a flash memory may retain stored data even when power is cut off Recently, storage devices including flash memories such as an embedded Multi-Media Card (eMMC), a Universal Flash Storage (UFS), a Solid State Drive (SSD), and memory cards have been widely used, and the storage devices are used to store or move a large amount of data. There is a continuous demand for a method and apparatus capable of improving the performance and reliability of a storage device.

SUMMARY

It is an aspect to provide a storage device capable of improving read reliability and performance by dynamically adjusting a history buffer storing a history read level or a history read level offset, a storage controller, and an operating method of the storage controller.

According to an aspect of one or more embodiments, there is provided a storage device comprising a non-volatile memory including a plurality of memory blocks; and a storage controller comprising a history buffer including a plurality of history read level storage areas corresponding to the plurality of memory blocks, the storage controller being configured to dynamically adjust a number of the plurality of history read level storage areas allocated to at least one of the plurality of memory blocks based on reliabilities of the plurality of memory blocks during runtime of the storage device, wherein the storage controller is configured to increase a number of history read level storage areas allocated to a first memory block among the plurality of memory blocks that has a relatively low reliability with respect to the reliabilities of remaining ones of the plurality of memory blocks.

According to another aspect of one or more embodiments, there is provided an operating method of a storage controller comprising a history buffer, the operating method comprising allocating a plurality of history read level storage areas included in the history buffer to a plurality of memory blocks included in a non-volatile memory, respectively; and performing a history buffer control operation for dynamically adjusting a number of history read level storage areas allocated to at least one of the plurality of memory blocks, based on reliabilities of the plurality of memory blocks, wherein the history buffer control operation comprises recovering a history read level storage area allocated to a first memory block among the plurality of memory blocks, when a reliability of the first memory block is greater than a first threshold value; and allocating an additional history read level storage area to the first memory block, when the reliability of the first memory block is equal to or less than a second threshold value, the second threshold value being less than the first threshold value.

According to yet another aspect of one or more embodiments, there is provided a storage controller configured to control a non-volatile memory, the storage controller comprising a host interface configured to communicate with a host; a non-volatile memory interface configured to communicate with the non-volatile memory; a history buffer including a plurality of history read level storage areas corresponding to a plurality of memory blocks included in the non-volatile memory; a block reliability detector configured to detect reliabilities of the plurality of memory blocks; and a history buffer controller configured to dynamically adjust a number of history read level storage areas allocated to at least one of the plurality of memory blocks based on the reliabilities.

BRIEF DESCRIPTION OF THE DRAWINGS

Embodiments will be more clearly understood from the following detailed description taken in conjunction with the accompanying drawings, in which.

DETAILED DESCRIPTION

Hereinafter, various embodiments are described in detail with reference to the accompanying drawings.

Figure 1:
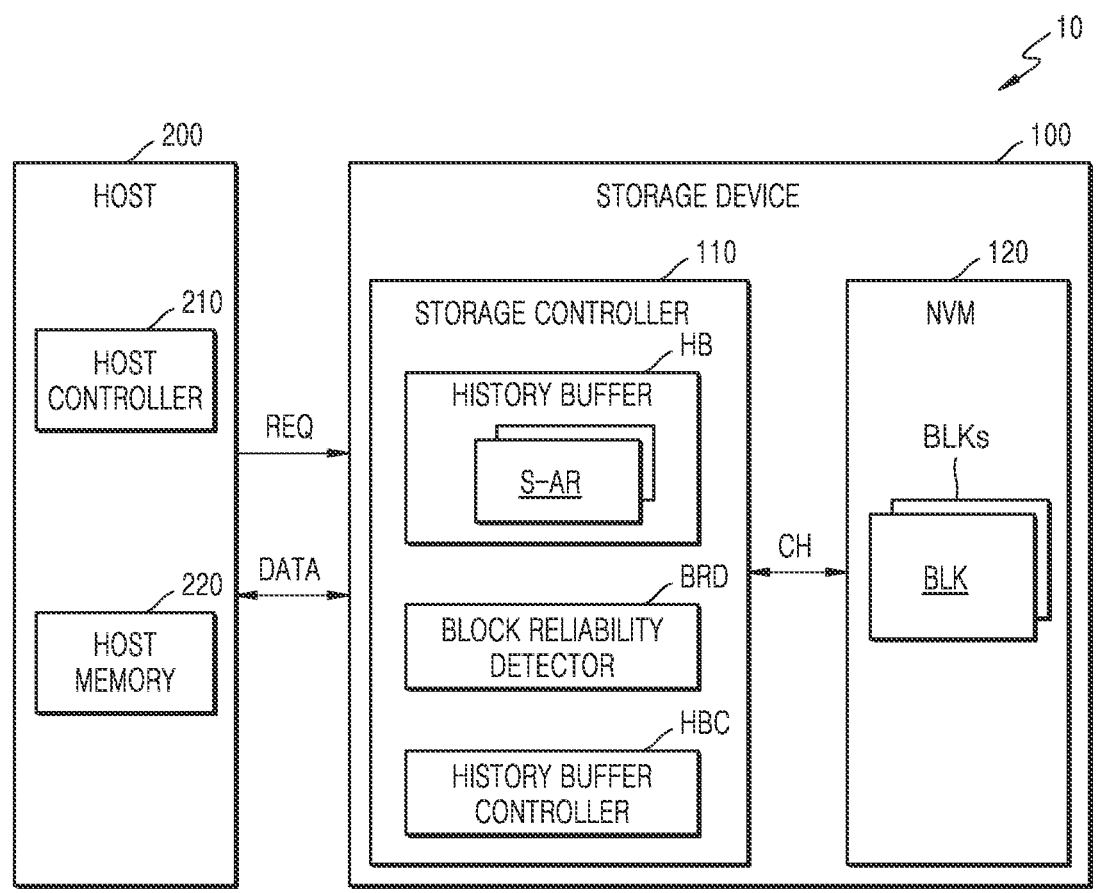
FIG. 1 is a block diagram of a storage system according to an embodiment.

FIG. 1 is a block diagram of a storage system 10 according to an embodiment.

Referring to FIG. 1, the storage system 10 may include a storage device 100 and a host 200 and thus may be referred to as a host-storage system. The storage device 100 may include a storage controller 110 and a non-volatile memory (NVM) 120, and the storage controller 110 and the NVM 120 may be connected to each other through a channel CH. According to an embodiment, the storage controller 110 may be referred to as a controller, a device controller, or a memory controller. According to an embodiment, the NVM 120 may be implemented with a plurality of memory chips or a plurality of memory dies. For example, each of the plurality of memory chips may be a Dual Die Package (DDP), a Quadruple Die Package (QDP), or an Octuple Die Package (ODP).

The host 200 may include a host controller 210 and a host memory 220. The host memory 220 may function as a buffer memory for temporarily storing data DATA to be transmitted to the storage device 100 or data DATA transmitted from the storage device 100. For example, the host controller 210 may be one of a plurality of modules included in an application processor (AP), and the AP may be implemented as a system on chip (SoC). The host memory 220 may be an embedded memory provided in the AP, or a non-volatile memory or a memory module arranged outside the AP.

The storage controller 110 may control the NVM 120 to write data DATA to the NVM 120 in response to a request REQ from the host 200, for example, a write request. In addition, the storage controller 110 may control the NVM 120 to read data DATA stored in the NVM 120 in response to a request REQ from the host 200, for example, a read request. Accordingly, the storage device 100 may include storage media for storing data DATA according to a request REQ from the host 200.

For example, the storage device 100 may include at least one of a solid state drive (SSD), an embedded memory, and a detachable external memory. For example, when the storage device 100 is an SSD, the storage device 100 may be a device conforming to a non-volatile memory express (NVMe) standard. For example, when the storage device 100 is an embedded memory or an external memory, the storage device 100 may be a device conforming to a UFS or eMMC standard. The host 200 and the storage device 100 may each generate a packet according to each adopted standard protocol and transmit the generated packet.

The NVM 120 may include a plurality of memory blocks BLKs including a memory block BLK, and each of the plurality of memory blocks BLKs may include a plurality of memory cells. For example, the memory block BLK may correspond to one of a plurality of memory blocks BLK1 to BLKz of FIG. 8. For example, at least one of the plurality of memory blocks BLKs may be a single level cell (SLC) block including SLCs. For example, at least one of the plurality of memory blocks BLKs may be a multi level cell (MLC) block including MLCs. For example, at least one of the plurality of memory blocks BLKs may be a triple level cell (TLC) block including TLCs. For example, at least one of the plurality of memory blocks BLKs may be a quadruple level cell (QLC) block including QLCs.

The storage controller 110 may include a history buffer HB. The storage controller 110 may manage the history buffer HB in units of memory blocks BLK. In other words, the storage controller 110 may manage the history buffer HB per memory block BLK. For example, the storage controller 110 may store a read level in the history buffer HB for each memory block BLK during runtime, and when a read request is received from the host 200, read data from the read-requested memory block BLK based on the read level stored in the history buffer HB. In the present specification, the read level stored in the history buffer HB is referred to as a "history read level," and a read operation based on the history read level is referred to as a "history read operation."

For example, the storage controller 110 may perform a read operation on the memory block BLK based on a first read level, and when the read operation is successful, store the first read level in the history buffer HB as a history read level for the memory block BLK. Thereafter, when a read request for the memory block is received from the host 200, the storage controller 110 may perform a history read operation based on the history read level of the memory block BLK stored in the history buffer HB.

When the read operation fails, the storage controller 110 may perform a read retry operation. In the present specification, when the previous read operation fails, a read operation performed by modifying the read level and subsequently using the corrected read level is referred to as a "read retry operation." For example, when the history read operation fails, the storage controller 110 may derive a corrected read level by executing recovery code by firmware, and may perform a read retry operation based on the corrected read level. When the read retry operation is successful, the storage controller 110 may update the history read level by storing the corrected read level as the history read level in the history buffer HB.

In a case in which the read operation is performed, when the read operation is performed based on a default read level to which a deterioration degree of the memory block BLK is not reflected, there is a high probability that the read operation will fail. However, the storage device 100 according to an embodiment manages a history read level in units of memory blocks BLK. That is, the storage device 100 may manage the history read level per memory block BLK. Thus, when a read operation is performed on the read-requested memory block BLK, the storage device 100 performs the history read based on the history read level of the corresponding memory block BLK, thereby increasing the read success probability. As described above, when the read operation fails, the recovery code may be executed, and in this case, a considerable time may be required for the execution of the recovery code. The storage device 100 according to an embodiment may minimize the number of executions of the recovery code, and thus, the performance of the storage device 100 may be improved.

In the embodiment illustrated in FIG. 1, the history buffer HB may include a plurality of storage areas S-AR. For example, the plurality of storage areas S-AR may be referred to as a plurality of history read level storage areas. Hereinafter, the "storage area" is referred to as a "history read level storage area." In an embodiment, a capacity of the history buffer HB may be fixed, and accordingly, the number of storage areas S-AR included in the history buffer HB may also be fixed. For example, the plurality of storage areas S-AR may respectively correspond to a plurality of memory blocks included in the NVM 120.

In an embodiment, the storage controller 110 may allocate the plurality of storage areas S-AR to the plurality of memory blocks BLKs, respectively, and dynamically adjust the number of storage areas S-AR allocated to at least one of the plurality of memory blocks BLKs during runtime of the storage device 100. For example, the storage controller 110 may further include a block reliability detector BRD and a history buffer controller HBC. The block reliability detector BRD may detect reliability of the plurality of memory blocks BLKs during runtime of the storage device 100, and provide the detected reliability to the history buffer controller HBC. The history buffer controller HBC may dynamically control the history buffer HB by dynamically adjusting the number of storage areas S-AR allocated to at least one of the plurality of memory blocks BLKs based on the detected reliability. Specific implementation examples of the block reliability detector BRD and the history buffer controller HBC are described below with reference to FIGS. 6 and 7.

Figure 2A:
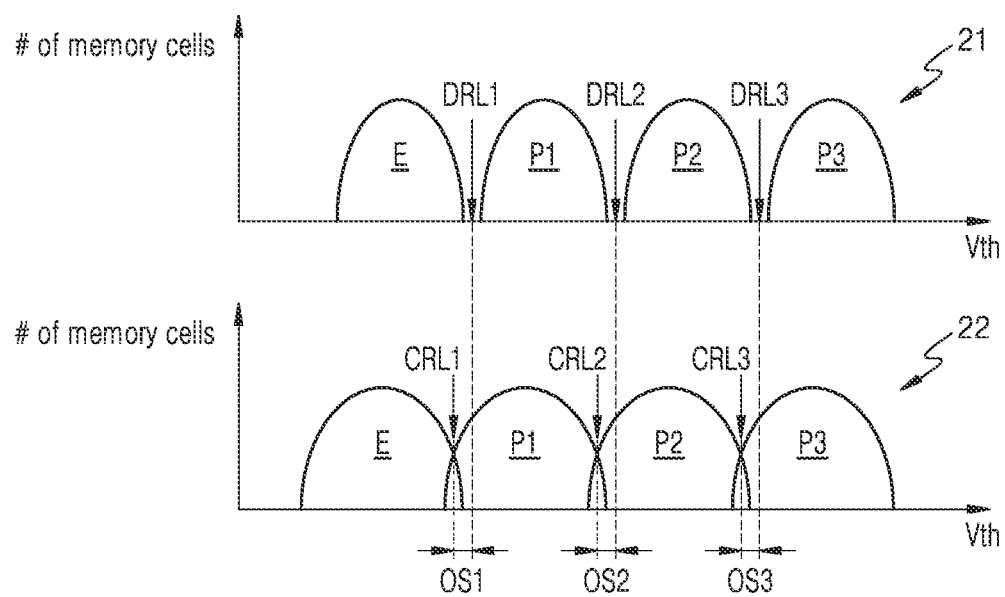
FIG. 2A shows an example of a distribution change according to deterioration of memory cells included in a non-volatile memory of the storage system of FIG. 1.

FIG. 2A shows an example of a distribution change according to deterioration of memory cells included in the non-volatile memory of the storage system of FIG. 1.

Referring to FIG. 2A, in an initial distribution 21 and a change distribution 22, the horizontal axis indicates a threshold voltage Vth, and the vertical axis indicates the number of memory cells. For example, when the memory cell is an MLC programmed with 2 bits, the memory cell may have one of an erase state E, a first program state P1, a second program state P2, and a third program state P3. The initial distribution 21 may be a distribution within a certain time after programming of the memory cells is completed. The storage device 100 may use a first default read level DRL1, a second default read level DRL2, and a third default read level DRL3 to determine the first to third program states P1 to P3, respectively.

The change distribution 22 may be a distribution after a certain time after program completion of the memory cells. When a retention time is increased, an amount of charge trapping of the memory cells is reduced, and distribution may be changed and shifted. Accordingly, threshold voltages of the memory cells may be changed compared to the initial distribution 21. For example, when the retention time is increased, charges stored in a charge storage layer of the memory cell may leak to a substrate, and accordingly, the threshold voltage of the memory cells may decrease. Distribution changes and shifts may be affected by elapsed time after program completion (i.e., retention time) as well as repetition of programs and/or erases (e.g., program/erase (P/E) cycles). For example, when a P/E cycle of a first word line and a P/E cycle of a second word line are different from each other even though a time elapsed after a completion of programming of the first word line and the second word line is the same, a change and shift of a distribution of the first word line may be different from a change and shift of a distribution of the second word line.

In this case, when reading is performed on the memory cells by using the first to third default read levels DRL1 to DRL3, respectively, a read error may occur in some of memory cells programmed in the first to third program states P1 to P3. Here, the read error may correspond to a case in which the number of fail bits in the read data is equal to or greater than a reference number correctable by an error correction code (ECC), and accordingly, the read error may be referred to as an uncorrectable ECC (UECC). In order to eliminate a read error, it is required to correct a read level by performing a read retry operation.

When a read error occurs during a normal read operation using a default read level, the storage device 100 may correct the read levels and perform a read retry based on the corrected read levels to obtain appropriate read levels at which a read operation may be successful, for example, a first corrected read level CRL1, a second corrected read level CRL2, and a third corrected read level CRL3. To this end, the storage controller 110 may execute recovery code by firmware. In this case, because it may take a considerable amount of time to execute the recovery code, the performance of the storage device 100 may deteriorate.

Figure 2B:
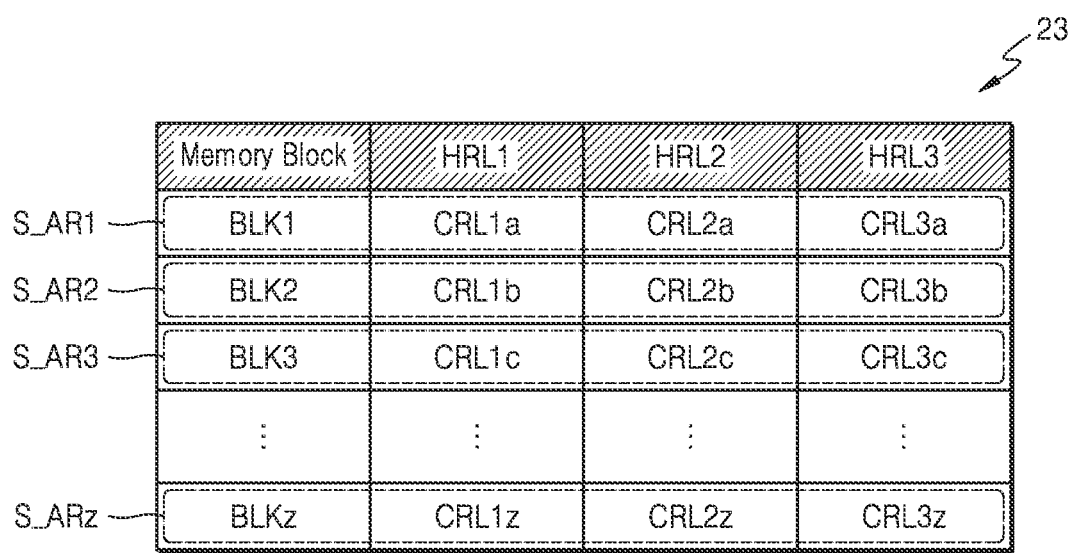
FIG. 2B shows an example of a history buffer corresponding to the distribution change of FIG. 2A, according to an embodiment.

FIG. 2B shows an example of a history buffer corresponding to a distribution change of FIG. 2A, according to an embodiment.

Referring to FIG. 2B, a history buffer 23 may include a plurality of storage areas S_AR1 to S_ARz, and the plurality of storage areas S_AR1 to S_ARz may be respectively allocated to the plurality of memory blocks BLK1 to BLKz (z is a positive integer). The history buffer 23 may correspond to the history buffer HB illustrated in FIG. 1. For example, the first storage area S_AR1 may be allocated to the first memory block BLK1 and store the corrected read levels CRL1a to CRL3a of the first memory block BLK1 as history read levels. For example, a first history read level HRL1 for the first memory block BLK1 may store a corrected read level CRL1a, a second history read level HRL2 may store a corrected read level CRL2a, and a third history read level HRL3 may store a corrected read level CRL3a, as illustrated in FIG. 2B. In addition, for example, the second storage area S_AR2 may be allocated to the second memory block BLK2 and store the corrected read levels CRL1b to CRL3b of the second memory block BLK2 as history read levels in a similar manner as the first storage area S_AR1.

Figure 2C:
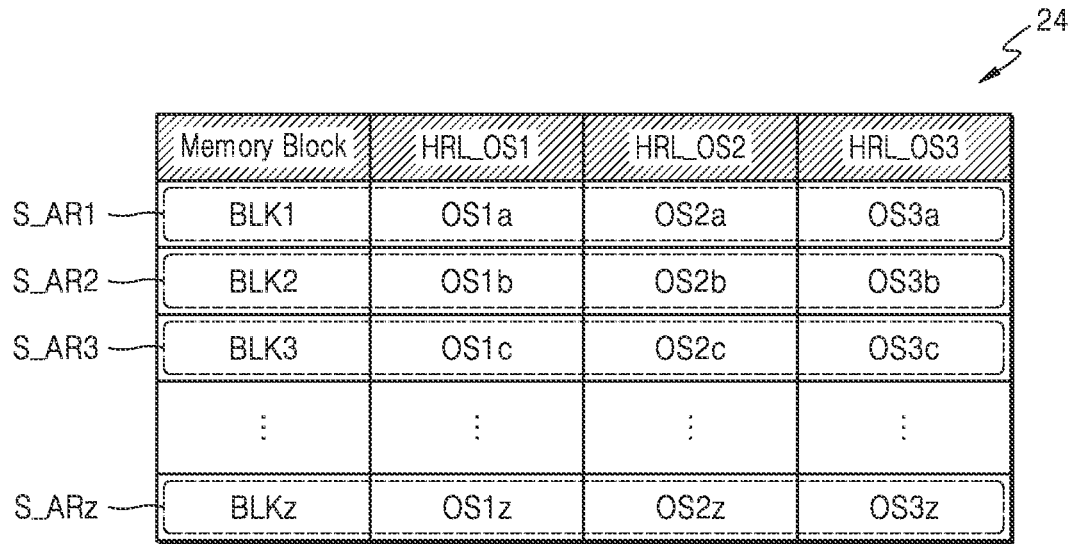
FIG. 2C shows another example of a history buffer corresponding to the distribution change of FIG. 2A, according to an embodiment.

FIG. 2C shows another example of a history buffer corresponding to a distribution change of FIG. 2A, according to an embodiment.

Referring to FIG. 2C, a history buffer 24 may include a plurality of storage areas S_AR1 to S_ARz, and the plurality of storage areas S_AR1 to S_ARz may be respectively allocated to the plurality of memory blocks BLK1 to BLKz.

The history buffer 24 may correspond to the history buffer HB illustrated in FIG. 1. For example, the first storage area S_AR1 may be allocated to the first memory block BLK1 and store read level offsets OS1a to O53a of the first memory block BLK1 as history read levels. For example, a first history read level offset HRL_OS1 for the first memory block BLK1 may store an offset OS1a, a second history read level offset HRL_OS2 may store an offset OS2a, and a third history read level offset HRL_OS3 may store an offset OS3a, as illustrated in FIG. 2C. In addition, for example, the second storage area S_AR2 may be allocated to the second memory block BLK2 and store read level offsets OS1b to OS3b of the second memory block BLK2 as history read level offsets, in a similar manner as the first storage area S_AR1.

Figure 3A:
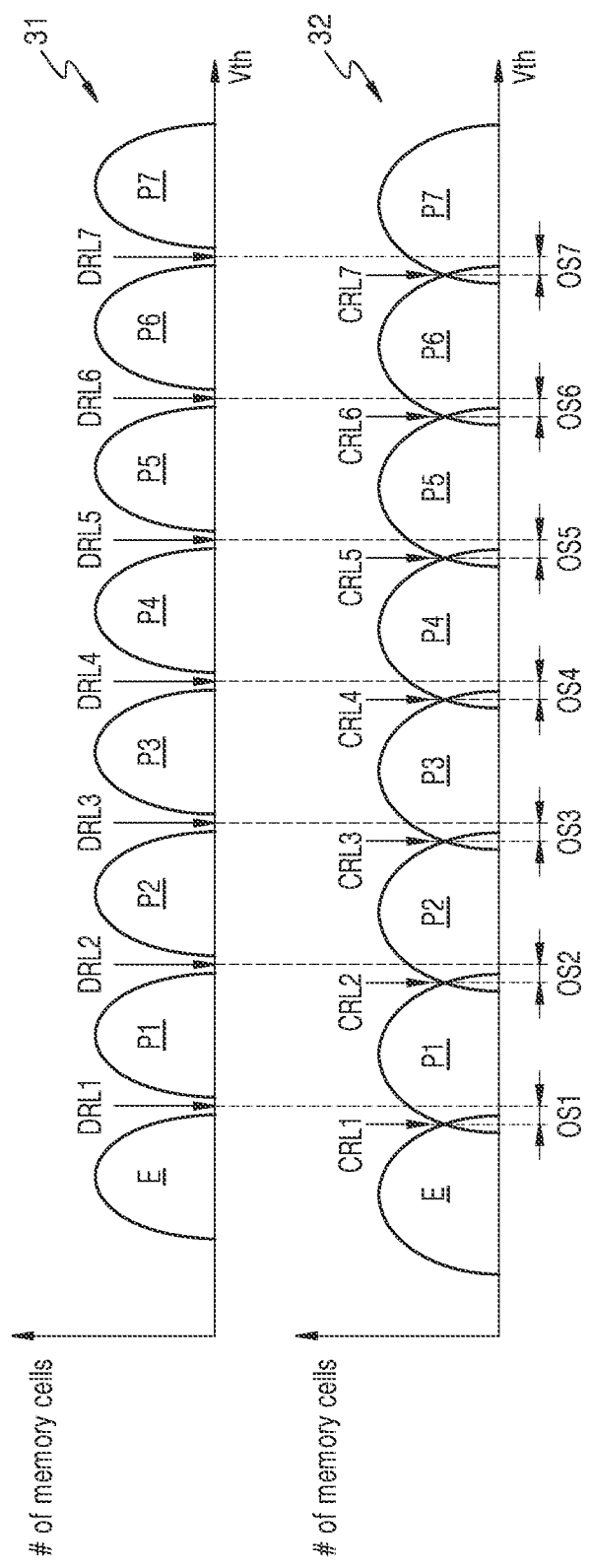
FIG. 3A shows an example of a distribution change according to deterioration of memory cells included in a non-volatile memory of the storage system of FIG. 1.

FIG. 3A shows an example of a distribution change according to deterioration of memory cells included in the non-volatile memory of the storage system of FIG. 1.

Referring to FIG. 3A, in an initial distribution 31 and a change distribution 32, the horizontal axis indicates a threshold voltage Vth, and the vertical axis indicates the number of memory cells. For example, when the memory cell is a TLC programmed with 3 bits, the memory cell may have one of an erase state E, a first program state P1, a second program state P2, a third program state P3, a fourth program state P4, a fifth program state P5, a sixth program state P6, and a seventh program state P7. The same concept described above with reference to FIG. 2A may be applied to the embodiment of FIG. 3A, and redundant descriptions thereof are omitted for conciseness.

The initial distribution 31 may be a distribution within a certain time after programming of the memory cells is completed. The storage device 100 may use a first default read level DRL1, a second default read level DRL2, a third default read level DRL3, a fourth default read level DRL4, a fifth default read level DRL5, a sixth default read level DRL6, and a seventh default read level DRL7 to determine the first to seventh program states P1 to P7, respectively. The change distribution 32 may be a distribution after a certain time after program completion of the memory cells. When a retention time is increased, an amount of charge trapping of the memory cells is reduced, and distribution may be changed and shifted. Accordingly, threshold voltages of the memory cells may be changed compared to the initial distribution 31. In this case, when reading is performed on the memory cells by using the first to seventh default read levels DRL1 to DRL7, respectively, a read error may occur in some of memory cells programmed in the first to seventh program states P1 to P7. When a read error occurs during a normal read operation using a default read level, the storage device 100 may correct the read levels and perform a read retry based on the corrected read levels to obtain appropriate read levels at which a read operation may be successful, for example, a first corrected read level CRL1, a second corrected read level CRL2, and a third corrected read level CRL3, a fourth corrected read level CRL4, a fifth corrected read level CRL5, and a sixth corrected read level CRL6, and a seventh corrected read level CRL7.

Figure 3B:
FIG. 3B shows an example of a history buffer corresponding to the distribution change of FIG. 3A, according to an embodiment.

FIG. 3B shows an example of a history buffer corresponding to a distribution change of FIG. 3A, according to an embodiment.

Referring to FIG. 3B, a history buffer 33 may include a plurality of storage areas S_AR1 to S_ARz, and the plurality of storage areas S_AR1 to S_ARz may be respectively allocated to the plurality of memory blocks BLK1 to BLKz. The history buffer 33 may correspond to the history buffer HB illustrated in FIG. 1. For example, the first storage area S_AR1 may be allocated to the first memory block BLK1 and store the corrected read levels CRL1a to CRL7a of the first memory block BLK1 as history read levels HRL1 to HRL7, respectively. In addition, for example, the second storage area S_AR2 may be allocated to the second memory block BLK2 and store the corrected read levels CRL1b to CRL7b of the second memory block BLK2 as history read levels HRL1 to HRL7, respectively.

Figure 3C:
FIG. 3C shows another example of a history buffer corresponding to the distribution change of FIG. 3A, according to an embodiment.

FIG. 3C shows another example of a history buffer corresponding to a distribution change of FIG. 3A, according to an embodiment.

Referring to FIG. 3C, a history buffer 34 may include a plurality of storage areas S_AR1 to S_ARz, and the plurality of storage areas S_AR1 to S_ARz may be respectively allocated to the plurality of memory blocks BLK1 to BLKz. The history buffer 34 may correspond to the history buffer HB illustrated in FIG. 1. For example, the first storage area S_AR1 may be allocated to the first memory block BLK1 and store read level offsets OS1a to OS7a of the first memory block BLK1 as history read levels HRL_OS1 to HRL_OS7, respectively. In addition, for example, the second storage area S_AR2 may be allocated to the second memory block BLK2 and store read level offsets OS1b to OS7b of the second memory block BLK2 as history read level offsets HRL_OS1 to HRL_OS7, respectively.

As described above with reference to FIGS. 2A to 3C, in a history read operation using a history read level or a history read level offset, the probability of occurrence of a read error may be reduced. However, as the number of word lines arranged in the memory block increases, word line variation between word lines in the memory block may increase. Here, the phrase "word line variation" may refer to a phenomenon in which a difference in reliability, etc. occurs between word lines due to a physical difference between word lines in a memory block. For example, despite the same deterioration of the memory block after the program, the distribution change of the memory block may be different for each word line. Accordingly, even when a read operation is performed on the memory block at the same history read level, the number of error bits may be different for each word line. Accordingly, the reliability of a history read operation may be deteriorated, and as a result, the reliability of the storage device 100 may be deteriorated.

Accordingly, according to embodiments, a history buffer may be dynamically controlled by dynamically increasing the number of history read level storage areas allocated to a memory block with relatively low reliability, and dynamically reducing the number of history read level storage areas allocated to a relatively reliable memory block. Through such dynamic control of the history buffer, the reliability difference between word lines may be reduced despite the physical difference between the word lines in the memory block. Hereinafter, a dynamic control operation of the history buffer is described in detail with reference to FIGS. 4 and 5.

Figure 4:
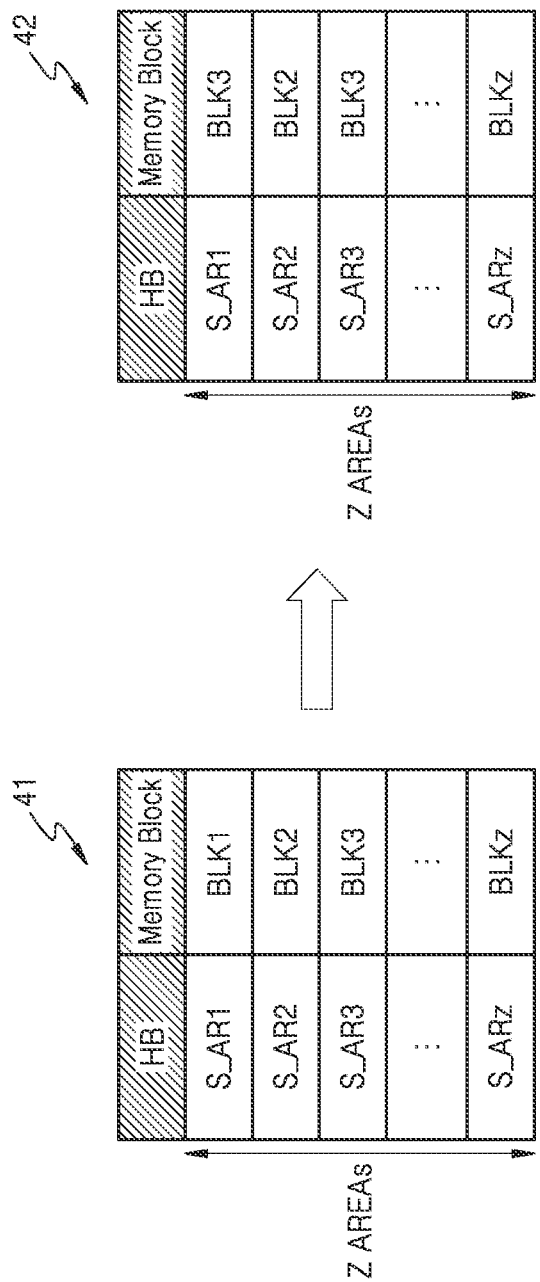
FIG. 4 shows a change in a history buffer according to a dynamic control operation of the history buffer according to an embodiment.

FIG. 4 shows a change in a history buffer according to a dynamic control operation of the history buffer according to an embodiment.

Referring to FIGS. 1 and 4 together, the storage controller 110 may update an initial history buffer 41 to a change history buffer 42 based on reliability of the plurality of memory blocks BLK1 to BLKz. For example, the initial history buffer 41 may correspond to one of the history buffers 23, 24, 33, and 34 illustrated in FIGS. 2B, 2C, 3B, and 3C. In this case, the initial history buffer 41 may include z storage areas S_AR1 to S_ARz, and the change history buffer 42 may also include z storage areas S_AR1 to S_ARz.

As described above, the number of storage areas in the initial history buffer 41 and the change history buffer 42 may be fixed.

Figure 5A:
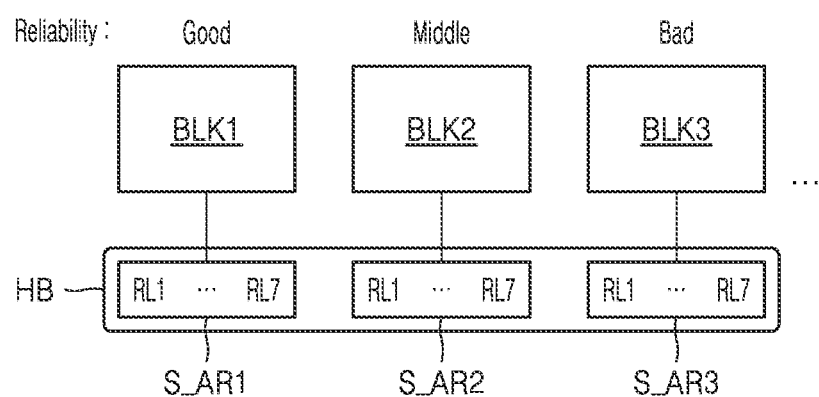
FIG. 5A shows a relationship between storage areas of an initial history buffer of FIG. 4 and memory blocks, according to an embodiment.

FIG. 5A shows a relationship between storage areas of the initial history buffer 41 of FIG. 4 and memory blocks according to an embodiment.

Referring to FIGS. 4 and 5A together, the first to third storage areas S_AR1, S_AR2, and S_AR3 of the initial history buffer 41 may be allocated initially to the first to third memory blocks BLK1, BLK2, and BLK3, respectively. For example, the first storage area S_AR1 may store history read levels RL1 to RL7 of the first memory block BLK1, the second storage area S_AR2 may store history read levels RL1 to RL7 of the second memory block BLK2, and the third storage area S_AR3 may store history read levels RL1 to RL7 of the third memory block BLK3.

Figure 5B:
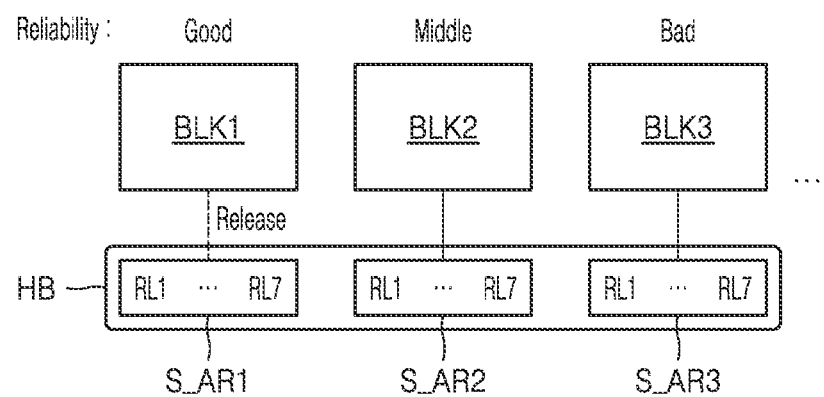
FIG. 5B shows a relationship between storage areas of a change history buffer of FIG. 4 and memory blocks, according to an embodiment.
Figure 5B:
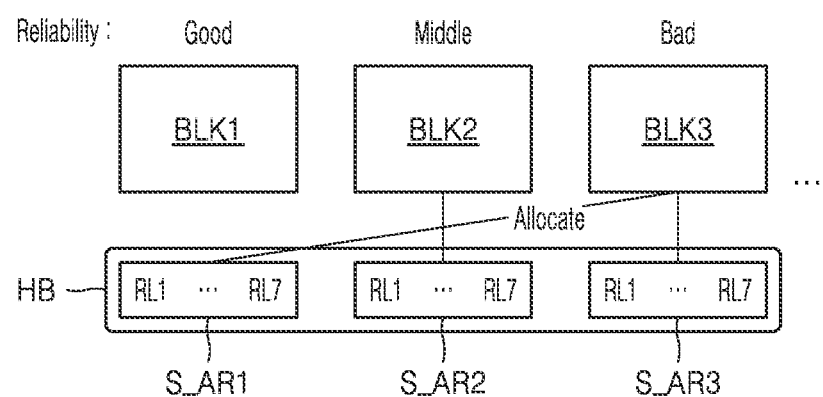

FIG. 5B shows a relationship between storage areas of the change history buffer 42 of FIG. 4 and memory blocks according to an embodiment.

Referring to FIGS. 1, 4, and 5B together, the block reliability detector BRD may detect reliability of the first to third memory blocks BLK1, BLK2, and BLK3. For example, the reliability of the first memory block BLK1 may be greater than a first threshold value (e.g., THV1 of FIG. 14), and accordingly, may be determined as a "good" block having relatively high reliability. For example, the second memory block BLK2 may have a reliability greater than a second threshold value (e.g., THV2 of FIG. 14) but less than or equal to the first threshold value, and thus may be determined as a "middle" block having an intermediate reliability. The second threshold value may be less than the first threshold value. For example, reliability of the third memory block BLK3 may be less than or equal to the second threshold value, and accordingly may be determined as a "bad" block having relatively low reliability.

The history buffer controller HBC may recover the first storage area S_AR1 allocated to the first memory block BLK1, and accordingly, the first storage area S_AR1 may become a free storage area. Based on the detected reliability from the block reliability detector BRD, the history buffer controller HBC may reduce the number of storage areas allocated to the first memory block BLK1 from 1 to 0, and a storage area may not be allocated to the first memory block BLK1. Accordingly, the storage controller 110 may perform a read operation on the first memory block BLK1 based on a default read level.

Subsequently, based on the detected reliability from the block reliability detector BRD, the history buffer controller HBC may additionally allocate the first storage area S_AR1 that was initially allocated to the first memory block BLK1, that is, a free storage area, to the third memory block BLK3. In other words, the history buffer controller HBC may increase the number of storage areas allocated to the third memory block BLK3 from one to two, and the first and third storage areas S_AR1 and S_AR3 may be allocated to the third memory block BLK3. Accordingly, the storage controller 110 may perform a read operation on the third memory block BLK3, based on history read levels stored in the first and third storage areas S_AR1 and S_AR3.

Figure 6:
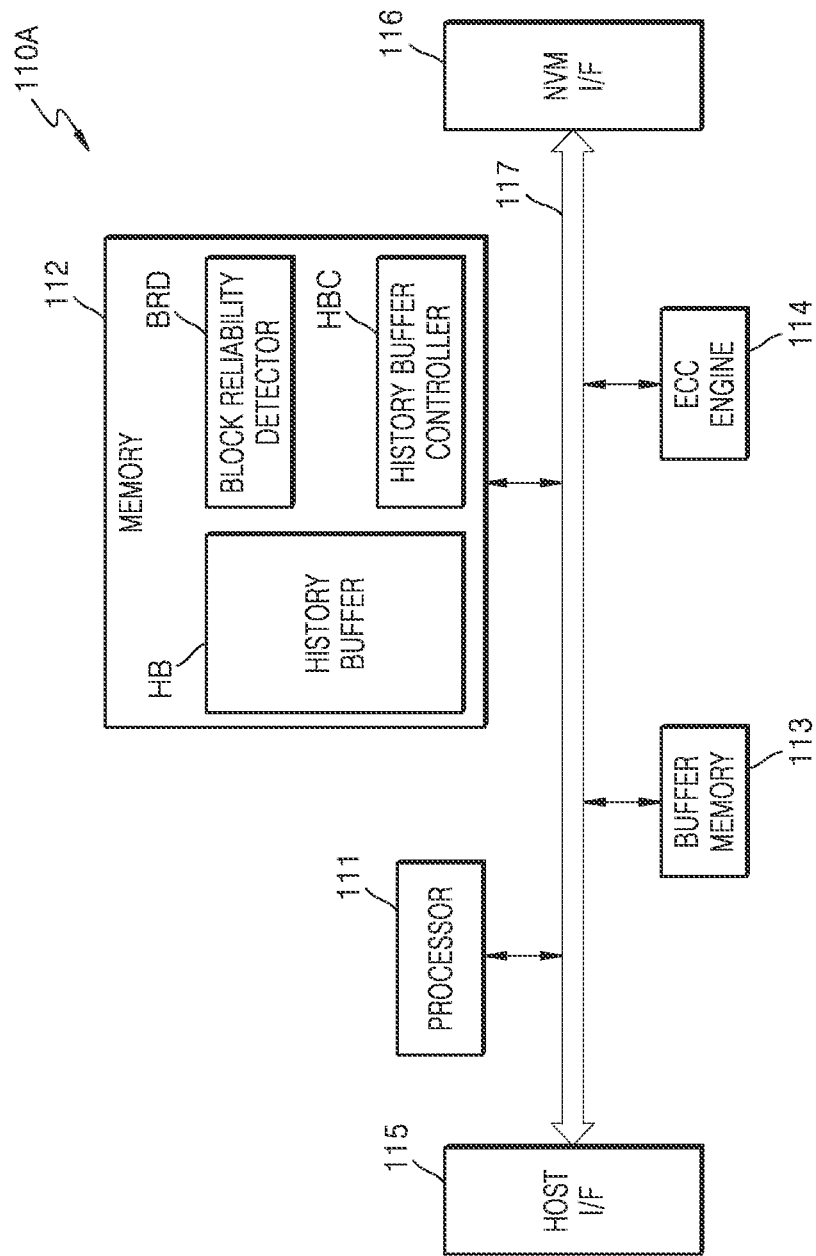
FIGS. 6 and 7 show a storage controller according to some embodiments.

FIG. 6 shows a storage controller according to an embodiment.

Referring to FIG. 6, a storage controller 110A may include a processor 111, a memory 112, a buffer memory 113, an error correction code ECC engine 114, a host interface I/F 115, and a non-volatile memory interface NVM I/F 116, which may communicate with each other via a bus 117. The storage controller 110A may correspond to an implementation example of the storage controller 110 of FIG. 1, and is described below with reference to FIGS. 1 and 6 together.

The processor 111 may include a central processing unit (CPU) or a microprocessor, and may control an overall operation of the storage controller 110A. In an embodiment, the processor 111 may be implemented as a multi-core processor, for example, as a dual-core processor or a quad-core processor. A flash translation layer (FTL) may be loaded into the memory 112, and data writing and reading operations for the NVM 120 may be controlled by the processor 111 executing the FTL loaded into the memory 112. The FTL may perform various functions such as address mapping, wear-leveling, garbage collection, and the like. The address mapping operation is an operation of changing a logical address received from the host 200 into a physical address used to actually store data in the NVM 120. Wear-leveling is a technique for preventing excessive degradation of a specific block by uniformly using memory blocks in a non-volatile memory, and may be exemplarily implemented through a firmware technique that balances erase counts of physical blocks. Garbage collection is a technique for securing usable capacity in the NVM 120 by copying valid data of a memory block to a new block and then erasing the existing block. For example, the memory 112 may be implemented as a volatile memory such as static random-access memory (SRAM), dynamic RAM (DRAM), or a non-volatile memory such as a flash memory or phase RAM (PRAM).

According to the embodiment of FIG. 6, the history buffer HB may be included in the memory 112, and the block reliability detector BRD and the history buffer controller HBC of FIG. 1 may be implemented as part of the FTL and loaded into the memory 112. In an embodiment, the history buffer HB, the block reliability detector BRD, and the history buffer controller HBC may be implemented with the same chip. However, embodiments are not limited thereto, and at least one of the history buffer HB, the block reliability detector BRD, and the history buffer controller HBC may be implemented in different chips. For example, the history buffer HB may be implemented as a part of a separate DRAM chip.

The buffer memory 113 may temporarily store data to be written to the NVM 120 or data read from the NVM 120. The buffer memory 113 may be provided in the storage controller 110A, but may be arranged outside the storage controller 110A.

The ECC engine 114 may perform an error detection and correction function for read data read from the NVM 120. More specifically, the ECC engine 114 may generate parity bits for write data to be written to the NVM 120, and the generated parity bits may be stored in the NVM 120 together with the write data. When data is read from the NVM 120, the ECC engine 114 may correct an error in the read data by using parity bits read from the NVM 120 together with the read data, and may output the error-corrected read data.

The host interface I/F 115 may transmit and receive packets to and from the host 200. A packet transmitted from the host 200 to the host interface 115 may include a command or data to be written to the NVM 120, and the like, and a packet transmitted from the host interface 115 to the host 200 may include a response to a command or data read from the NVM 120.

The non-volatile memory interface NVM I/F 116 may transmit data to be written to the NVM 120 to the NVM 120 or receive data from the NVM 120. The non-volatile memory interface 116 may be implemented to comply with a standard protocol such as a toggle or an Open NAND Flash Interface (ONFI).

Figure 7:
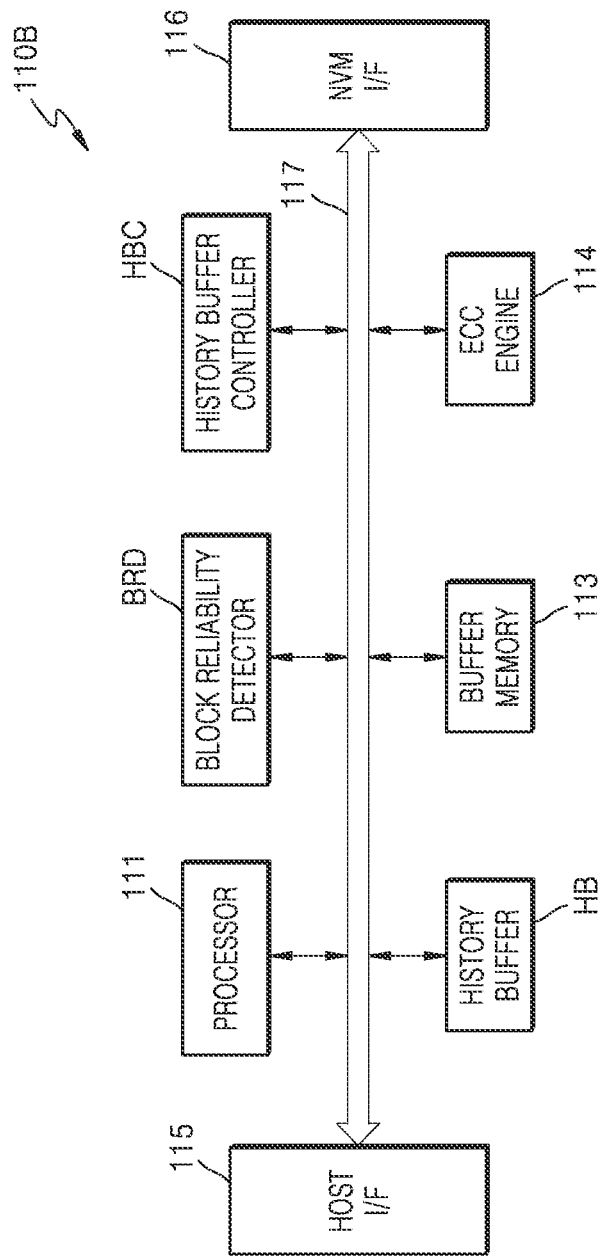

FIG. 7 shows a storage controller according to an embodiment.

Referring to FIG. 7, a storage controller 110B may include the processor 111, the history buffer HB, the block reliability detector BRD, the history buffer controller HBC, the buffer memory 113, the ECC engine 114, the host interface I/F 115, and the non-volatile memory interface NVM I/F 116, which may communicate with each other via the bus 117. The storage controller 110B corresponds to a modified example of the storage controller 110A of FIG. 6, and redundant descriptions thereof are omitted for conciseness.

In an embodiment, the block reliability detector BRD and the history buffer controller HBC may be implemented in software. For example, the NVM 120 may store program code, and when power is applied to the storage device 100, the program code stored in the NVM 120 may be loaded into an operating memory of the storage controller 110. The processor 111 may dynamically control the history buffer HB based on reliability of the plurality of memory blocks as described above with reference to FIGS. 1 to 6 by executing the program code loaded into the operating memory.

However, embodiments are not limited thereto, and in an embodiment, the block reliability detector BRD and the history buffer controller HBC may be implemented in hardware. Further, in an embodiment, the block reliability detector BRD and the history buffer controller HBC may be implemented as a combination of software and hardware. Furthermore, in an embodiment, at least one of the block reliability detector BRD and the history buffer controller HBC may be implemented to be included in the non-volatile memory interface NVM I/F 116.

Figure 8:
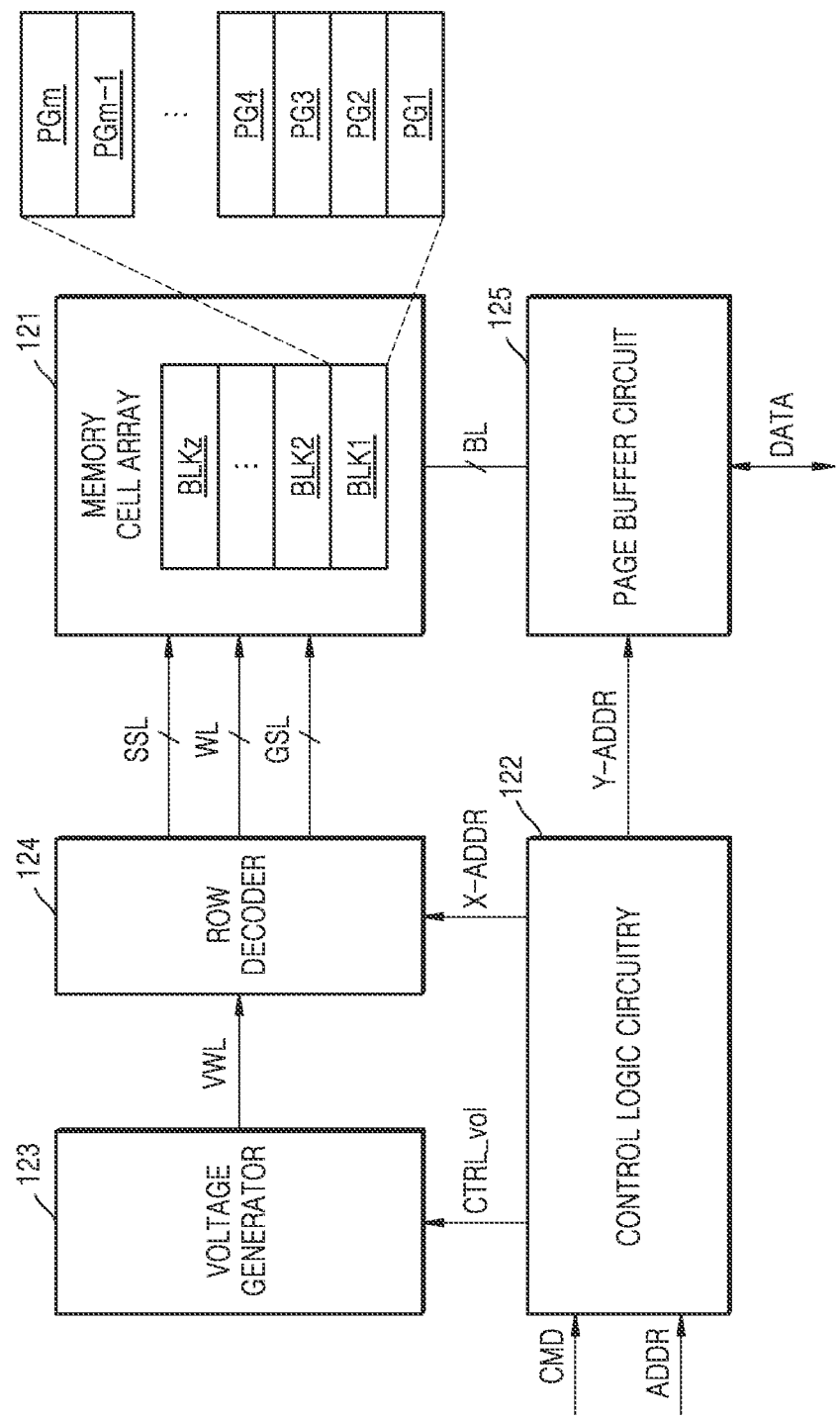
FIG. 8 is a block diagram of a non-volatile memory according to an embodiment.

FIG. 8 is a block diagram of the NVM 120 according to an embodiment.

Referring to FIG. 8, the NVM 120 may include a memory cell array 121, a control logic circuitry 122, a voltage generator 123, a row decoder 124, and a page buffer circuit 125. Although not shown in FIG. 8, the NVM 120 may further include a memory interface circuit, and may further include column logic, a pre-decoder, a temperature sensor, a command decoder, an address decoder, and the like.

The memory cell array 121 may include the plurality of memory blocks BLK1 to BLKz, and each of the plurality of memory blocks BLK1 to BLKz may include a plurality of pages PG1 to PGm, where z and m are positive integers, and may be variously changed according to embodiments. For example, a memory block may be a unit of erase, and a page may be a unit of write and read. The memory cell array 121 may be connected to the page buffer circuit 125 through bit lines BL, and may be connected to the row decoder 124 through word lines WL, string select lines SSL, and ground select lines GSL.

In an embodiment, the memory cell array 121 may include a three-dimensional memory cell array, and the three-dimensional memory cell array may include a plurality of NAND strings. Each of the NAND strings may include memory cells respectively connected to word lines stacked vertically on a substrate. The entire contents of U.S. Pat. Nos. 7,679,133; 8,553,466; 8,654,587; 8,559,235; and U.S. Patent Application Publication No. 2011/0233648 are incorporated by reference herein in their entireties. In an embodiment, the memory cell array 121 may include a two-dimensional memory cell array, and the two-dimensional memory cell array may include a plurality of NAND strings arranged in row and column directions. In some embodiments, the memory cell array 121 may include other various types of non-volatile memories, and accordingly, the NVM 120 may include magnetic RAM (MRAM), spin-transfer torque MRAM, conductive bridging RAM (CBRAM), ferroelectric RAM (FeRAM), PRAM, resistive RAM, and other various types of memory.

The control logic circuitry 122 may generally control various operations in the NVM 120. The control logic circuitry 122 may output various control signals in response to a command CMD and/or an address ADDR. For example, the control logic circuitry 122 may output a voltage control signal CTRL_vol, a row address X_ADDR, and a column address Y_ADDR.

The voltage generator 123 may generate various types of voltages for performing program, read, and erase operations, based on the voltage control signal CTRL_vol. For example, the voltage generator 123 may generate a program voltage, a read voltage, a program verify voltage, an erase voltage, etc. as a word line voltage VWL.

The row decoder 124 may select one of the plurality of word lines WL in response to the row address X_ADDR and may select one of the plurality of string select lines SSL. For example, during a program operation, the row decoder 124 may apply a program voltage and a program verify voltage to a selected word line, and during a read operation, apply a read voltage to the selected word line.

The page buffer circuit 125 may select at least one bit line from among the bit lines BL in response to the column address Y_ADDR. The page buffer circuit 125 may operate as a write driver or a sense amplifier according to an operation mode.

Figure 9:
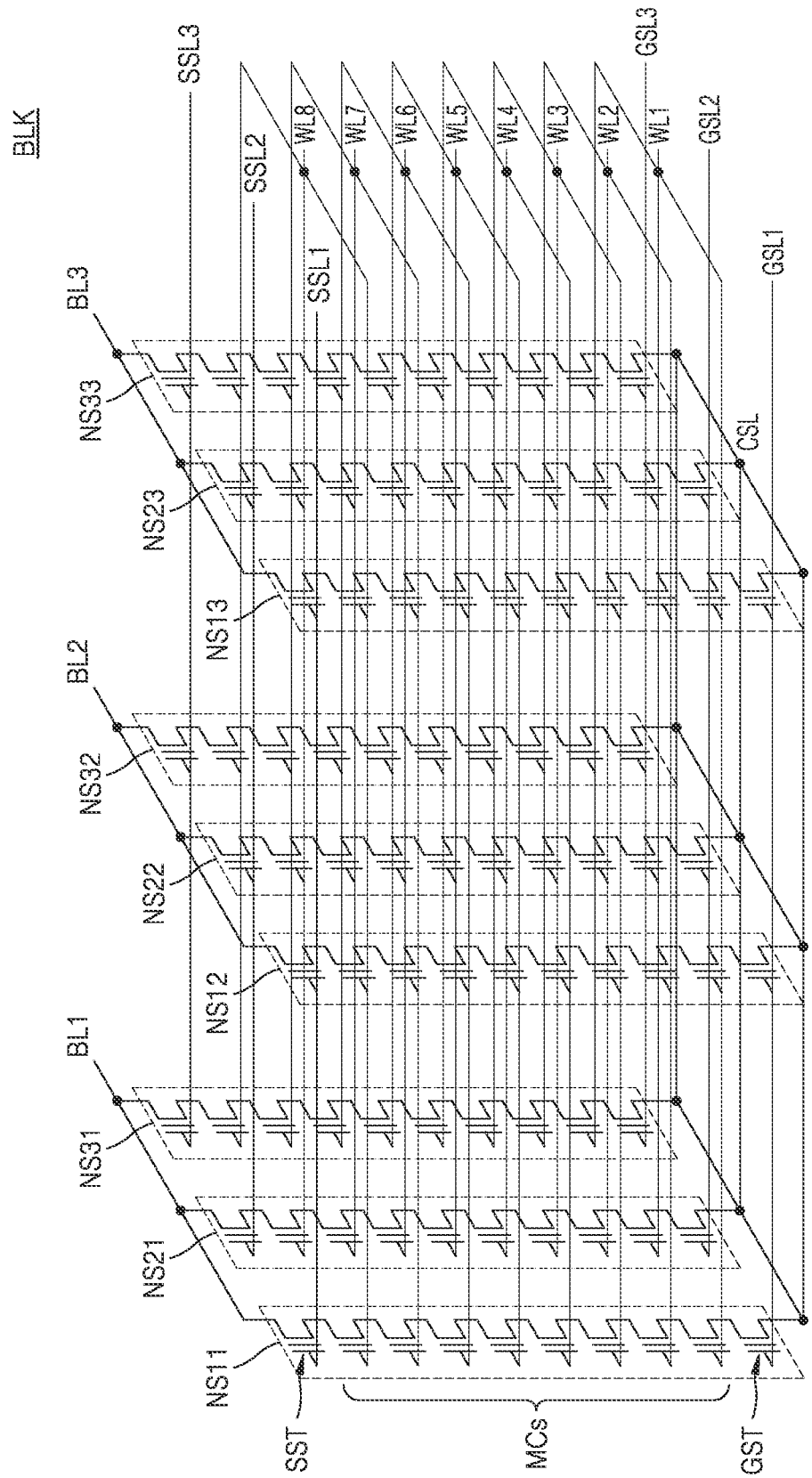
FIG. 9 is a circuit diagram illustrating a memory block according to an embodiment.

FIG. 9 is a circuit diagram illustrating a memory block BLK according to an embodiment.

Referring to FIG. 9, the memory block BLK may correspond to one of a plurality of memory blocks BLK1 to BLKz of FIG. 8. The memory block BLK may include NAND strings NS11 to NS33, and each of the NAND strings NS11 to NS33 (for example, NS11) may include a string select transistor SST, a plurality of memory cells MCs, and a ground select transistor GST, which are connected in series. The transistors SST and GST and the memory cells MCs included in each of the NAND strings NS11 to NS33 may form a stacked structure on the substrate in a vertical direction.

Bit lines BL1 to BL3 may extend in a first direction, and word lines WL1 to WL8 may extend in a second direction. The NAND strings NS11, NS21, and NS 31 may be positioned between the first bit line BL1 and a common source line CSL, the NAND strings NS12, NS22, and NS32 may be positioned between the second bit line BL2 and the common source line CSL, and the NAND strings NS13, NS23, and NS33 may be positioned between a third bit line BL3 and the common source line CSL.

The string select transistor SST may be connected to corresponding string select lines SSL1 to SSL3. The memory cells MCs may be respectively connected to the corresponding word lines WL1 to WL8. The ground select transistor GST may be connected to corresponding ground select lines GSL1 to GSL3. The string select transistor SST may be connected to a corresponding bit line, and the ground select transistor GST may be connected to the common source line CSL. Here, the number of NAND strings, the number of word lines, the number of bit lines, the number of ground select lines, and the number of string select lines may be variously changed according to embodiments.

Figure 10A:
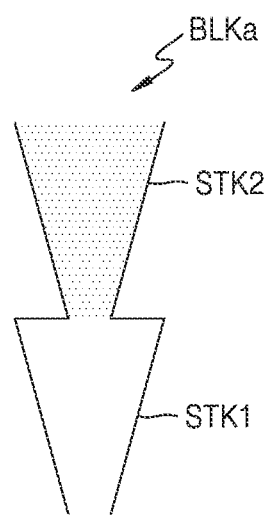
FIG. 10A shows a memory block having a two-stack structure according to an embodiment.

FIG. 10A shows a memory block BLKa having a two-stack structure according to an embodiment. Referring to FIG. 10A, the memory block BLKa may have a two-stack structure including a first stack STK1 and a second stack STK2, and may correspond to one of the plurality of memory blocks BLK1 to BLKz of FIG. 9. In this case, a word line variation may be considerably large between word lines included in the first stack STK1 and word lines included in the second stack STK2. Accordingly, when a read operation is performed on a page included in the second stack STK2 by using a history read level according to a read result of a page included in the first stack STK1, the number of error bits may increase, and thus, read reliability for the memory block BLKa may be deteriorated.

Figure 10B:
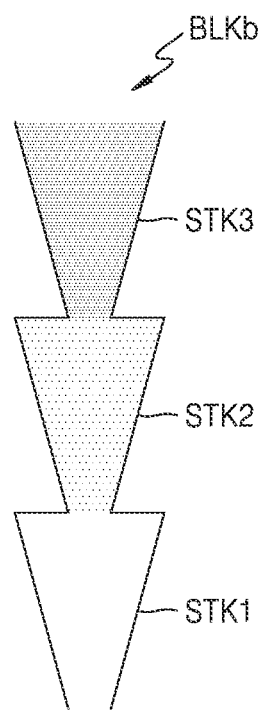
FIG. 10B shows a memory block having a three-stack structure according to an embodiment.

FIG. 10B shows a memory block BLKb having a three-stack structure according to an embodiment. Referring to FIG. 10B, the memory block BLKb may have a three-stack structure including a first stack STK1, a second stack STK2, and a third stack STK3 and may correspond to one of the plurality of memory blocks BLK1 to BLKz of FIG. 9. Embodiments described above with reference to FIG. 10A may be applied to the embodiment of FIG. 10B, and redundant descriptions thereof are omitted for conciseness. Embodiments are not limited to a memory block having a two-stack structure or a three-stack structure and, in some embodiments, the memory block BLK may have an N-stack structure including N stacks, where N may be a positive integer of 4 or more. In addition, in other embodiments, the memory block may be implemented as a single stack structure.

Figure 11:
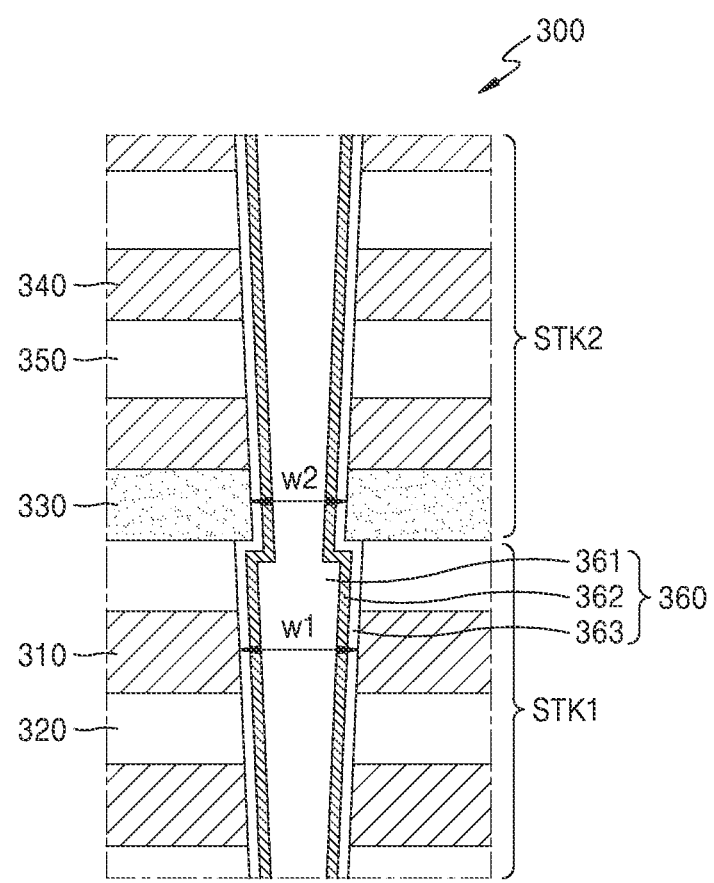
FIG. 11 shows a portion of a cross-section of a memory block according to an embodiment.

FIG. 11 shows a portion of a cross-section of a memory block according to an embodiment.

Referring to FIGS. 8 and 11 together, when the NVM 120 is a vertical memory device, in order to form a channel structure in a three-dimensional memory block, an etching process for forming a channel hole may be performed, and a diameter of the channel hole may be different according to a height of the memory block. For example, the diameter of the channel hole may decrease from the top to the bottom in a memory block having a three-dimensional structure. In order to prevent the diameter of the channel hole from being greatly reduced in the three-dimensional memory block, an etching process for forming the channel hole may be performed at least twice. For example, after a first stack (i.e., a first stacked structure) STK1 is formed on the substrate, an etching process is performed, and thereafter, a second stack (i.e., a second stacked structure) may be formed on the first stack STK1. In addition, an etching process may be performed on the second stack STK2.

As illustrated in FIG. 11, a memory block 300 may have a three-dimensional structure. The first stack STK1 may include a gate electrode 310 and an insulating layer 320 that are alternately arranged in a vertical direction. In addition, the second stack STK2 stacked on the first stack STK1 may include a gate electrode 340 and an insulating layer 350 that are alternately arranged in a vertical direction. According to an embodiment, an interstructure layer 330 may be arranged between the first stack STK1 and the second stack STK2. In addition, a channel structure 360 may include a channel 362, a dielectric film structure 363 surrounding an outer wall of the channel 362, and a channel buried film pattern 361 arranged inside the channel 362. The above structure is only an example, and embodiment are not limited thereto. In some embodiments, the memory block 300 may have other various structures in which at least two etching processes are performed. In FIG. 11, w1 represents the diameter of the channel hole at one height in STK1, and w2 represents the diameter of the channel hole at one height in STK2.

Figure 12A:
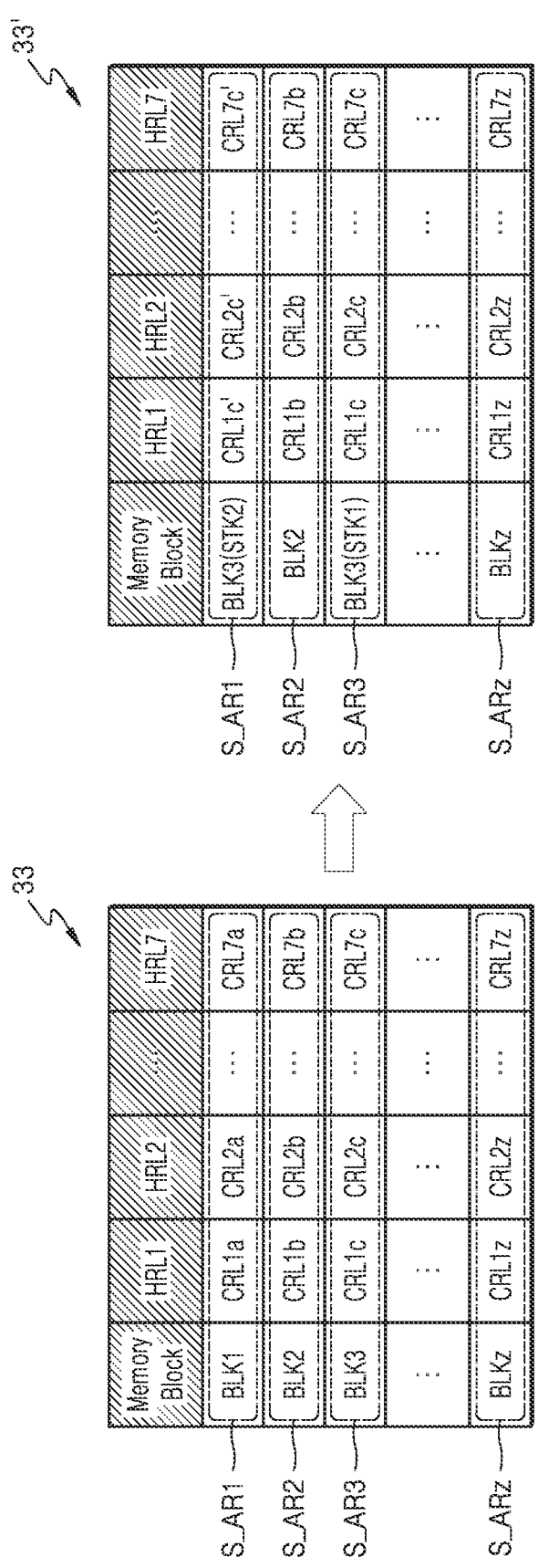
FIGS. 12A and 12B show changes in a history buffer according to a dynamic control operation of the history buffer, respectively, according to some embodiments.

FIG. 12A shows a change in a history buffer according to a dynamic control operation of the history buffer according to an embodiment.

Referring to FIGS. 1 and 12A together, the initial history buffer 33 may correspond to, for example, the history buffer 33 of FIG. 3B, and the descriptions provided above with reference to FIGS. 3A and 3B may be applied to the embodiment of FIG. 12A. For example, the first memory block BLK1 may be a good block having relatively high reliability, and the third memory block BLK3 may be a bad block having relatively low reliability. The storage controller 110 may recover the first storage area S_AR1 allocated to the first memory block BLK1 and additionally allocate the first storage area S_AR1 to the third memory block BLK3, to thereby update the initial history buffer 33 into a change history buffer 33'.

For example, the third memory block BLK3 may correspond to the memory block BLKa of FIG. 10A. For example, the storage controller 110 may store history read levels CRL1$c$ to CRL7$c$ of the first stack STK1 of the third memory block BLK3 in the third storage area S_AR3, and store history read levels CRL1$c'$ to CRL7$c'$ of the second stack STK2 of the third memory block BLK3 in the first storage area S_ARL Accordingly, during a read operation on a page included in the first stack STK1 of the third memory block BLK3, the history read levels CRL1$c$ to CRL7$c$ stored in the third storage area S_AR3 may be used, and during a read operation on a page included in the second stack STK2 of the third memory block BLK3, the history read levels CRL1$c'$ to CRL7$c'$ stored in the first storage area S_AR1 may be used.

However, embodiments are not limited to an example of allocating history read level storage areas for each stack. In some embodiments, the history read level storage areas may be allocated according to a word line number in the memory block. For example, different history read level storage areas may be allocated to the first to twentieth word lines and the twenty-first to fortieth word lines in a single stack. In other words, a first storage area may be allocated to the first to twentieth word lines of a stack, and a second storage area may be allocated to the twenty-first to fortieth word lines of the stack.

Figure 12B:
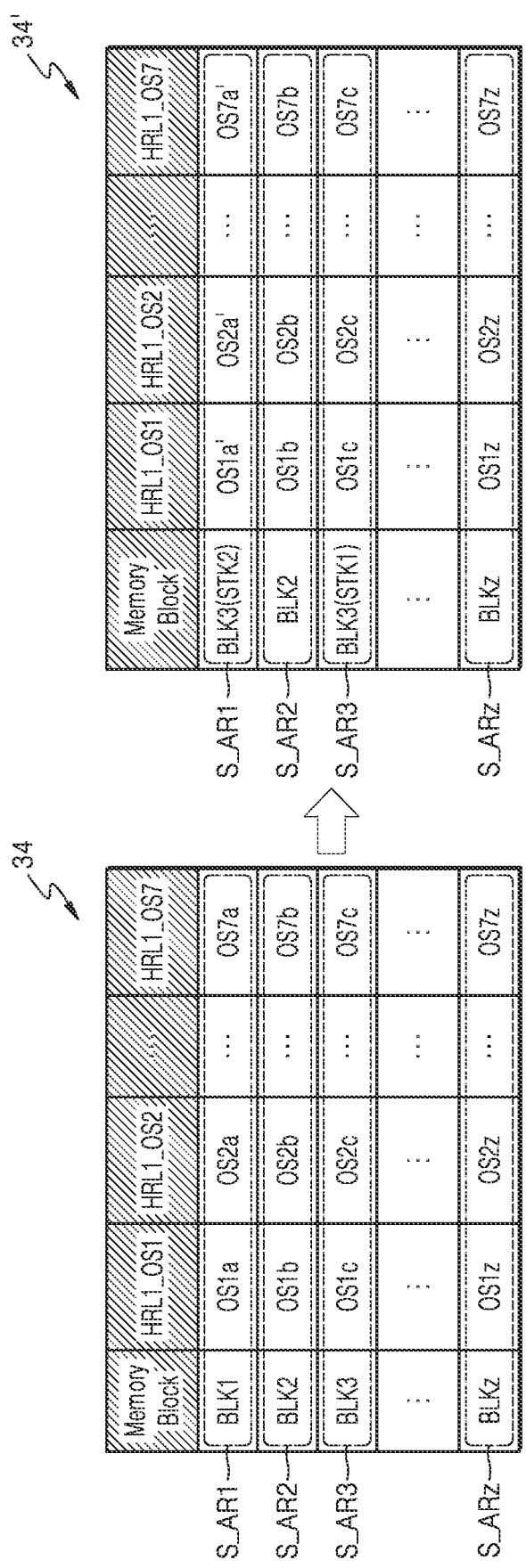

FIG. 12B shows a change in a history buffer according to a dynamic control operation of the history buffer according to an embodiment.

Referring to FIGS. 1 and 12B together, the initial history buffer 34 may correspond to, for example, the history buffer 34 of FIG. 3C, and the descriptions provided above with reference to FIGS. 3A and 3C may be applied to the embodiment of FIG. 12B. For example, the first memory block BLK1 may be a good block having relatively high reliability, and the third memory block BLK3 may be a bad block having relatively low reliability. The storage controller 110 may recover the first storage area S_AR1 allocated to the first memory block BLK1 and additionally allocate the first storage area S_AR1 to the third memory block BLK3, to thereby update the initial history buffer 34 into a change history buffer 34'.

For example, the third memory block BLK3 may correspond to the memory block BLKa of FIG. 10A. For example, the storage controller 110 may store history read level offsets OS1$c$ to OS7$c$ of the first stack STK1 of the third memory block BLK3 in the third storage area S_AR3, and store history read level offsets OS1$a'$ to OS7$a'$ of the second stack STK2 of the third memory block BLK3 in the first storage area S_AR1. Accordingly, during a read operation on a page included in the first stack STK1 of the third memory block BLK3, the history read level offsets OS1c to OS7c stored in the third storage area S_AR3 may be used, and during a read operation on a page included in the second stack STK2 of the third memory block BLK3, the history read level offsets OS1a' to OS7a' stored in the first storage area S_AR1 may be used.

Figure 13:
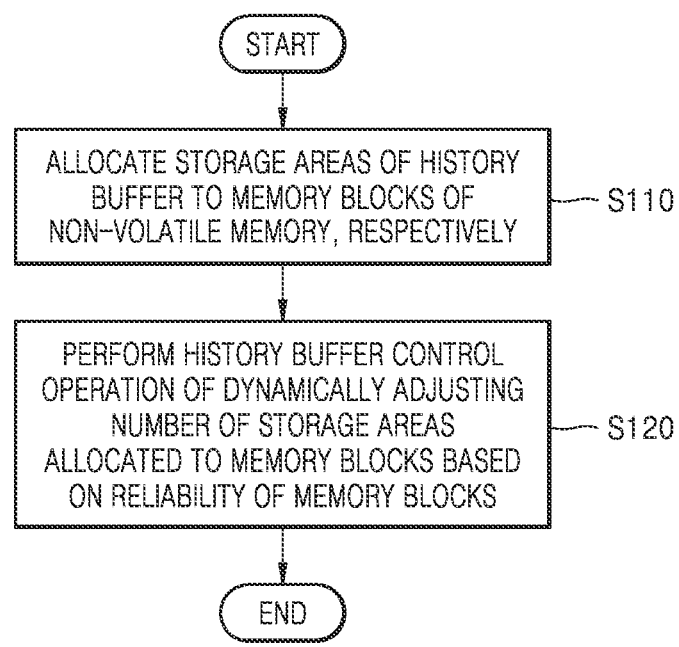
FIG. 13 is a flowchart of an operating method of a storage controller, according to an embodiment.

FIG. 13 is a flowchart of an operating method of a storage controller, according to an embodiment.

Referring to FIG. 13, an operating method of the storage controller 110 according to an embodiment includes a method of dynamically controlling a history buffer during runtime of a storage device. For example, the operating method may be time-series performed by the storage controller 110 of FIG. 1, and the descriptions provided above with reference to FIGS. 1 to 12B may also be applied to the embodiment of FIG. 13.

In operation S110, the storage controller 110 may allocate the storage areas S-AR of the history buffer HB to the memory blocks BLKs of the NVM 120, respectively. In this case, the history buffer HB may include the plurality of storage areas S-AR. For example, the plurality of storage areas S-AR may be referred to as the plurality of history read level storage areas, as described above. A capacity of the history buffer HB may be fixed, and accordingly, the number of history read level storage areas S-AR may also be fixed.

In operation S120, the storage controller 110 may perform a history buffer control operation of dynamically adjusting the number of storage areas allocated to the memory blocks BLKs based on the reliability of the memory blocks BLKs. The storage controller 110 may detect the reliability of the memory blocks BLKs in different manners. For example, in an embodiment, the storage controller 110 may detect the reliability of the memory blocks BLKs by executing prevention recovery code, as described below with reference to FIGS. 15 to 19. In an embodiment, the storage controller 110 may detect the reliability of the memory blocks BLKs by executing recovery code, as described below with reference to FIGS. 20 to 22. In an embodiment, the storage controller 110 may detect the reliability of the memory blocks BLKs based on a history read level offset of the history buffer HB, as described below with reference to FIG. 23.

Figure 14:
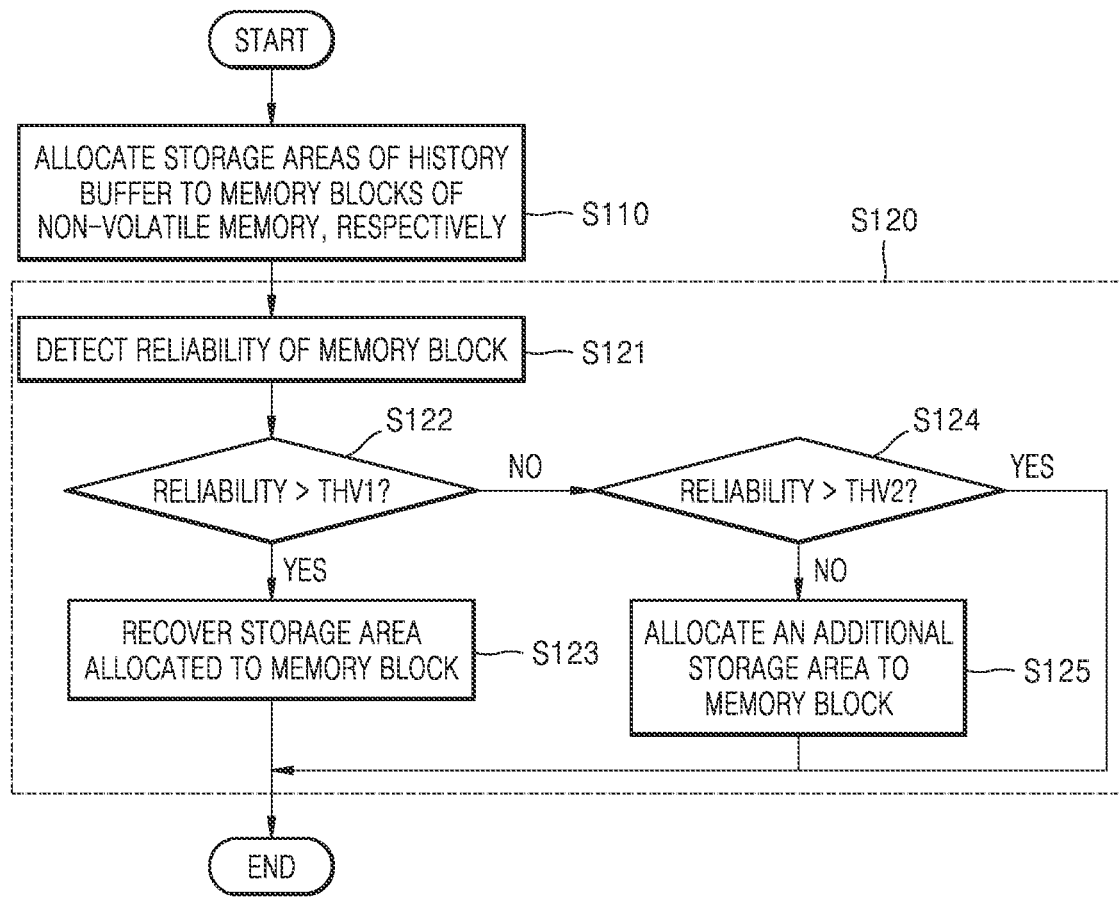
FIG. 14 is a flowchart illustrating the operating method of the storage controller of FIG. 13 in more detail, according to an embodiment.

FIG. 14 is a flowchart illustrating the operating method of the storage controller of FIG. 13 in more detail, according to an embodiment.

Referring to FIG. 14, operation S120 of FIG. 13 may include operations S121 to S125. In operation S121, the storage controller 110 may detect the reliability of the memory block BLK. In operation S122, the storage controller 110 may determine whether the detected reliability is greater than a first threshold value THV1. As a result of the determination, when the detected reliability is greater than the first threshold value THV1 (S122, YES), the storage controller 110 may determine the memory block BLK as a good block. Subsequently, in operation S123, the storage controller 110 may recover a storage area allocated to the memory block BLK.

In an embodiment, the number of storage areas initially allocated to the memory block BLK may be one, and the number of storage areas allocated to the memory block BLK by operation S123 may be zero. Accordingly, a history read operation using a history read level may not be performed on the memory block BLK having relatively high reliability, and thereafter, a normal read operation using a default read level may be performed on the memory block BLK. In an embodiment, the number of storage areas initially allocated to the memory block BLK may be two, and the number of storage areas allocated to the memory block BLK by operation S123 may be one. Accordingly, for the memory block BLK whose reliability is improved than before, the history read operation may be performed by using a smaller number of history read levels than before. For example, when the memory block BLK has a two-stack structure, a history read operation may be performed with respect to a first stack and a second stack by using the same history read level.

When the detected reliability is not greater than the first threshold value THV1 (S122, NO), in operation S124 the storage controller 110 may determine whether the detected reliability is greater than a second threshold value THV2. In this case, the second threshold value THV2 may be defined as a value less than the first threshold value THV1. In other words, THV2<THV1. As a result of the determination, when the detected reliability is greater than the second threshold value THV2 (S124, YES), the storage controller 110 may determine the memory block BLK as a middle block, and in this case, a history buffer control operation may be terminated. When the detected reliability is not greater than the second threshold value THV2(S124, NO), the storage controller 110 may determine the memory block BLK as a bad block. Subsequently, in operation S125, the storage controller 110 may allocate an additional storage area to the memory block BLK.

In an embodiment, the number of storage areas initially allocated to the memory block BLK may be one, and the number of storage areas allocated to the memory block BLK by operation S125 may be two. For example, when the memory block BLK has a two-stack structure, a history read operation may be performed with respect to a first stack and a second stack by using different history read levels from each other. In an embodiment, the number of storage areas initially allocated to the memory block BLK may be zero, and the number of storage areas allocated to the memory block BLK by operation S125 may be one. Accordingly, the history read operation may be performed on the memory block BLK having deteriorated reliability compared to the previous history read operation, by using a greater number of history read levels than before.

In an embodiment, the storage controller 110 may include a machine learning module. For example, the machine learning module may estimate the reliability of the memory blocks BLKs. For example, the machine learning module may estimate the reliability of the memory blocks based on read data from the memory blocks and/or the result of the ECC operation on the read data. For example, the machine learning module may dynamically determine a number of the storage areas S-AR allocated to the memory block BLK. For example, the machine learning module may determine a recovery amount for the storage area allocated to the memory block BLK. For example, the machine learning module may determine an additional quota for the memory block BLK. The additional quota is a number of additional storage areas S-AR to allocate to the memory block BLK.

Figure 15:
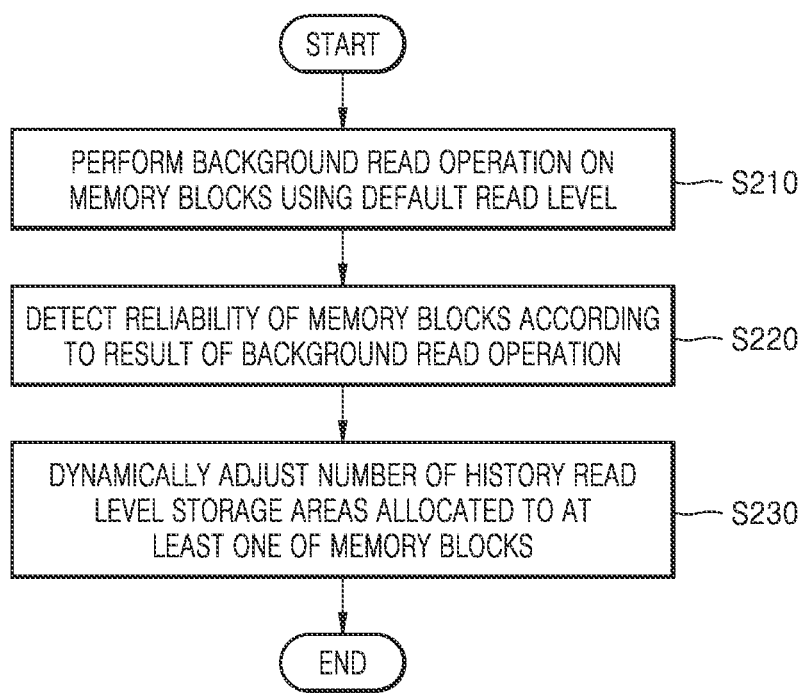
FIG. 15 is a flowchart of a method of dynamically controlling a history buffer according to an embodiment.

FIG. 15 is a flowchart of a method of dynamically controlling a history buffer, according to an embodiment.

Referring to FIG. 15, in operation S210, the storage controller 110 may perform a background read operation on the memory blocks BLKs by using a default read level. For example, the background read operation may include a patrol read operation, as described below with reference to FIG. 19. For example, the background read operation may include a media scan operation, as described below with reference to FIG. 20.

In operation S220, the storage controller 110 may detect the reliability of the memory blocks BLKs according to a result of the background read operation. For example, when the background read operation of the memory block BLK among the memory blocks BLKs fails, it may be determined that the reliability of the memory block BLK is relatively low. In operation S230, the storage controller 110 may dynamically adjust the number of history read level storage areas allocated to at least one of the memory blocks BLKs. For example, the storage controller 110 may dynamically adjust the number of history read level storage areas allocated to the at least one of the memory blocks BLKs, based on the detected reliability. For example, when the reliability of the memory block is relatively low, the number of history read level storage areas allocated to the memory block may be increased.

Figure 16:
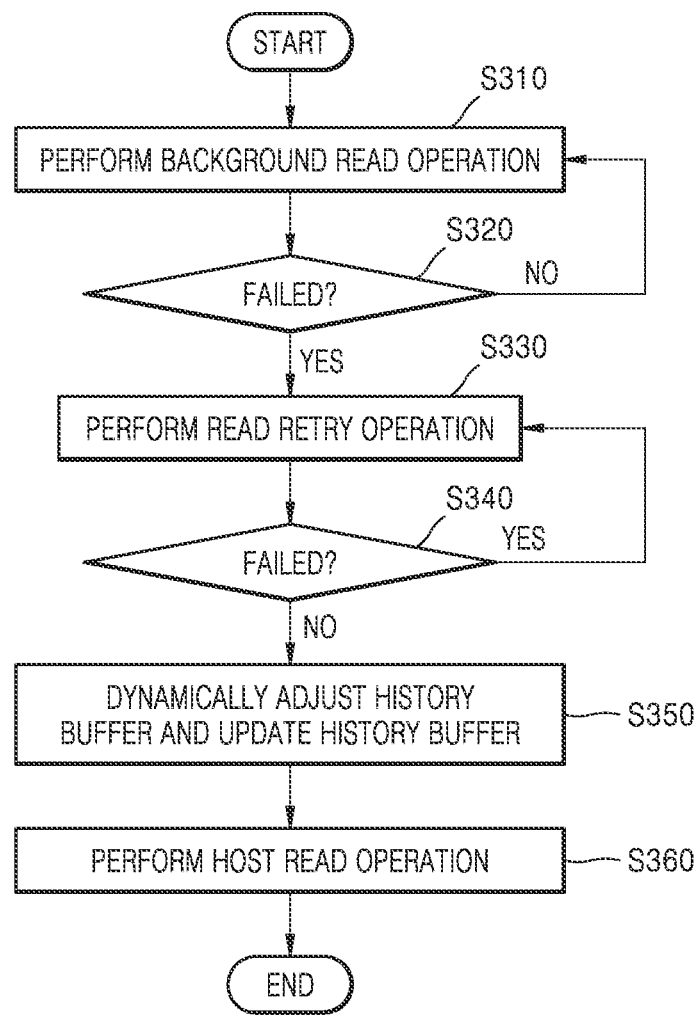
FIG. 16 is a flowchart illustrating the method of dynamically controlling the history buffer of FIG. 15 in more detail, according to an embodiment.

FIG. 16 is a flowchart illustrating the method of dynamically controlling the history buffer of FIG. 15 in more detail, according to an embodiment.

Referring to FIG. 16, in the method, a storage device may periodically perform a background read operation on memory blocks included in an NVM, and dynamically control the history buffer according to a result of the background read operation. For example, the operating method according to the embodiment of FIG. 16 may be performed in a time series in the storage device 100 of FIG. 1. The descriptions provided above with reference to FIGS. 1 to 15 may also be applied to the embodiment of FIG. 16.

In operation S310, the storage device 100 may perform a background read operation. The storage device 100 may periodically perform the background read operation by using a default read level for the plurality of memory blocks BLKs included in the NVM 120 without receiving a read request from the host 200. In operation S220, the storage controller 110 may determine whether the background read operation fails. As a result of the determination, when the background read operation fails (S320, YES), operation S330 may be performed. Otherwise, when the background read operation does not fail (S320, NO), operation S310 may be performed for another memory block.

In operation S330, the storage device 100 may perform a read retry operation. The storage device 100 may perform the read retry operation on the corresponding memory block by using a corrected read level that is different from the default read level. In operation S340, the storage controller 110 may determine whether the read retry operation fails. As a result of the determination, when the read retry operation does not fail (i.e., is successful) (S340, NO), operation S350 may be performed. When the read retry operation fails (S340, YES), operation S330 may be performed again.

In operation S350, the storage controller 110 may dynamically adjust the history buffer HB and update the history buffer HB. The storage device 100 may update the history buffer HB by storing the corrected read level as the history read level for the corresponding memory block. In operation S360, the storage device 100 may perform a host read operation. When a read request is received from the host 200, the storage device 100 may perform a host read operation by using the history buffer HB that has been dynamically adjusted and updated.

In some embodiments, the operating method may further include, before performing operation S310, selecting a representative page for each memory block. For example, in each of the plurality of memory blocks, at least one representative page may be selected based on at least one of the number of programs and erases, the number of reads, an elapsed program time, a read disturb, a program disturb, a physical location of each memory block, or a physical location of each page.

Figure 17:
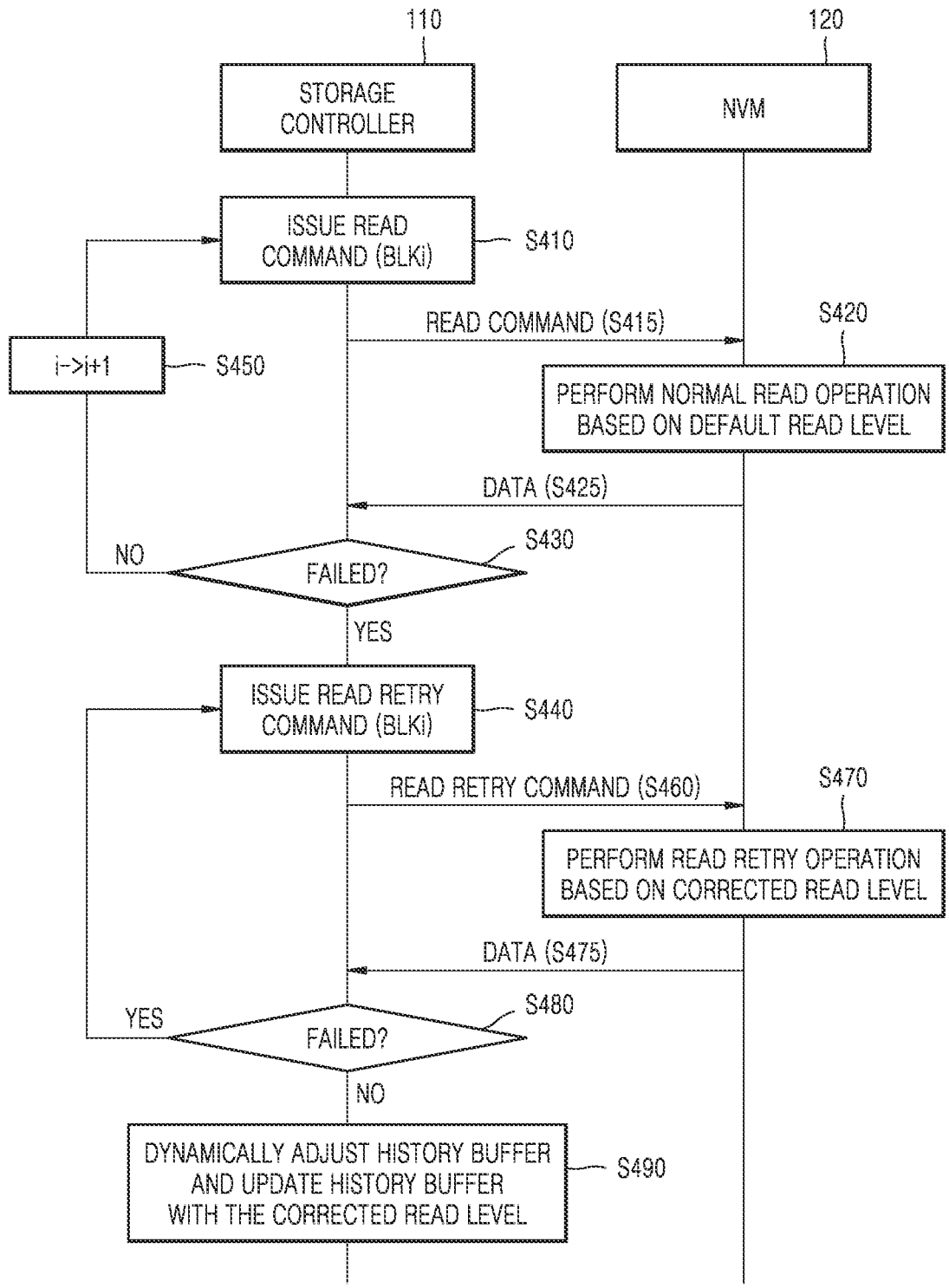
FIG. 17 is a flowchart of an operation between a storage controller and a non-volatile memory according to the method of FIG. 16, according to an embodiment.

FIG. 17 is a flowchart of an operation between a storage controller and a non-volatile memory according to the method of FIG. 16, according to an embodiment.

Referring to FIGS. 1, 6, and 17 together, in operation S410, the storage controller 110 may issue a read command for an $i^{th}$ memory block BLKi. Here, i may be any natural number between 1 and z. For example, the storage controller 110 may not receive a read request from the host 200 and may issue a read command by itself. In addition, the storage controller 110 may issue an address for a representative page included in the $i^{th}$ memory block BLKi and determine a read voltage for the $i^{th}$ memory block BLKi as a default read level DRL. In operation S415, the storage controller 110 may transmit a read command to the NVM 120. In some embodiments, the read command may include an address and/or a read voltage for the $i^{th}$ memory block BLKi. In other embodiments, the storage controller 110 may transmit an address together with the read command to the NVM 120, and may transmit the read voltage for the $i^{th}$ memory block BLKi as a control signal together with the read command.

In operation S420, the NVM 120 may perform a normal read operation by using a default read level in response to the read command. In this case, the NVM 120 may perform a normal read operation on the representative page of the $i^{th}$ memory block BLKi. In operation S425, the NVM 120 may transmit data read by the normal read operation to the storage controller 110.

In operation S430, the storage controller 110 may determine whether the normal read operation fails. For example, the storage controller 110 may determine whether the normal read operation fails, based on the data received in S425. For example, the ECC engine 114 may perform an ECC operation on the received data and determine whether the number of fail bits detected in the received data exceeds an error correction capability of the ECC engine 114. As a result of the determination, when the number of fail bits exceeds the error correction capability, it may be determined that the normal read operation fails (S430, YES), and operation S440 may be performed. When the number of fail bits does not exceed the error correction capability or when the data does not include fail bits, it may be determined that the normal read operation does not fail (i.e., is successful) (S430, NO), and operation S450 may be performed. In operation S450, the storage controller 110 may increase i by 1 and perform a background read operation on an $(i+1)^{th}$ memory block.

In operation S440, the storage controller 110 may issue a read retry command to the $i^{th}$ memory block BLKi. For example, the storage controller 110 may not receive a read retry request from the host 200 and may issue a read retry command by itself. In some embodiments, the storage controller 110 may issue an address for a read-failed page from among representative pages included in the $i^{th}$ memory block BLKi, and may determine a read retry voltage for the $i^{th}$ memory block BLKi as the corrected read level. In operation S460, the storage controller 110 may transmit a read retry command to the NVM 120. In some embodiments, the read retry command may include an address and/or a read retry voltage for the $i^{th}$ memory block BLKi. In other embodiments, the storage controller 110 may transmit an address together with the read retry command to the NVM 120, and may transmit the read retry voltage for the $i^{th}$ memory block BLKi as a control signal together with the read retry command.

In operation S470, the NVM 120 may perform a read retry operation by using the corrected read level in response to the read retry command. In this case, the NVM 120 may perform the read retry operation on the representative page of the $i^{th}$ memory block BLKi. In operation S475, the NVM 120 may transmit data read by the read retry operation to the storage controller 110.

In operation S480, the storage controller 110 may determine whether the read retry operation fails. For example, the storage controller 110 may determine whether the read retry operation fails, based on the data received in S475. For example, the ECC engine 114 may perform an ECC operation on the received data and determine whether the number of fail bits detected in the received data exceeds an error correction capability of the ECC engine 114. As a result of the determination, when the number of fail bits exceeds the error correction capability, it may be determined that the read retry operation fails (S480, YES), and operation S440 may be performed again. When the number of fail bits does not exceed the error correction capability or when the data does not include fail bits, it may be determined that the read retry operation does not fail (i.e., is successful) (S480, NO), and operation S490 may be performed. In operation S490, the storage controller 110 may dynamically adjust the history buffer HB and store the corrected read level, thereby updating the history buffer HB.

Figure 18:
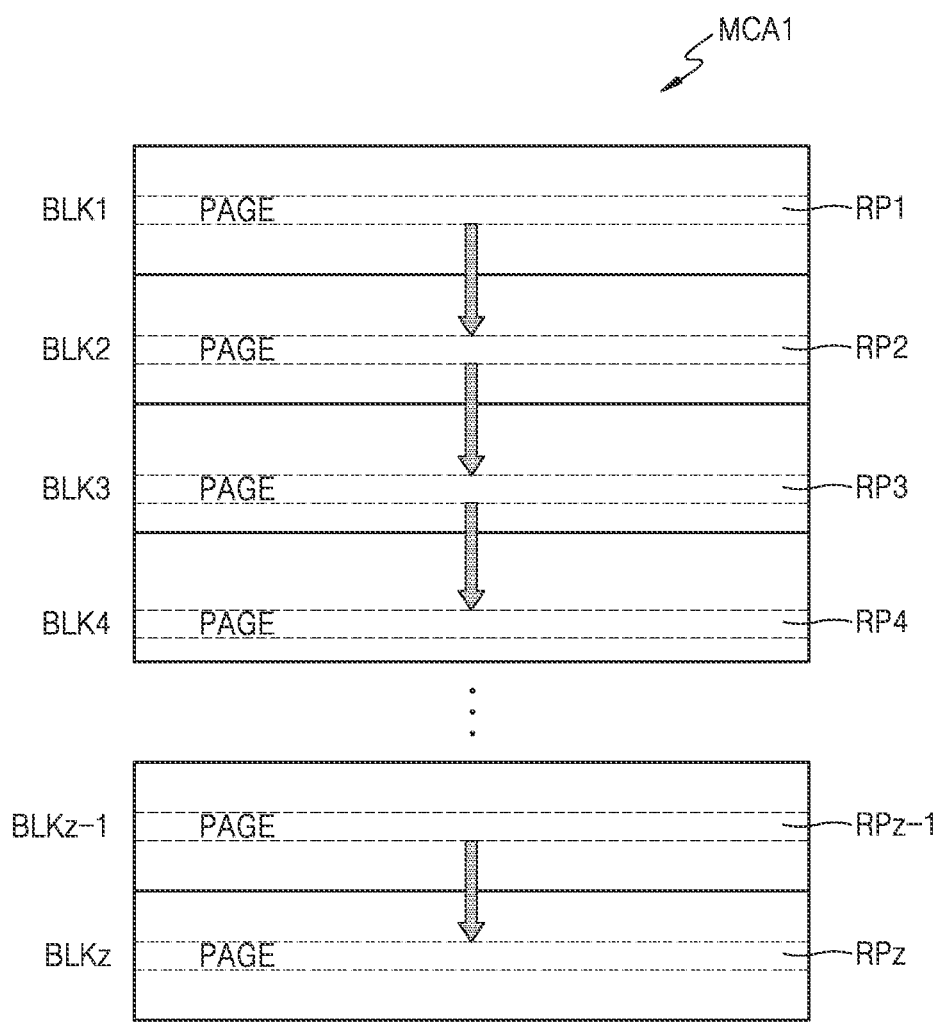
FIG. 18 shows an example of a background read operation according to an embodiment.

FIG. 18 shows an example of a background read operation according to an embodiment.

Referring to FIGS. 1 and 18 together, a memory cell array MCA1 may include first to $z^{th}$ memory blocks BLK1 to BLKz, and may be an example of the memory cell array 121 of FIG. 8. According to an embodiment, at least one representative page RP may be selected from each of the memory blocks BLK1 to BLKz, and a background read operation may be performed on selected representative pages RP1 to RPz for the memory blocks BLK1 to BLKz. The background read operation may be referred to as a "patrol read operation."

The storage controller 110 may periodically perform a background read operation on the first to $z^{th}$ memory blocks BLK1 to BLKz according to a physical address. In an embodiment, an execution order of the background read operation may be changed according to physical locations or deterioration information of the first to $z^{th}$ memory blocks BLK1 to BLKz. For example, the background read operation may be performed according to an arrangement order of the first to $z^{th}$ memory blocks BLK1 to BLKz. For example, the background read operation may be performed on the first representative page RP1, the background read operation may be performed on the second representative page RP2, and then the background read operation may be performed on the third representative page RP3. In another example, the background read operation may be performed on the first representative page RP1, the background read operation may be performed on the third representative page RP3, and then the background read operation may be performed on the second representative page RP2.

Figure 19:
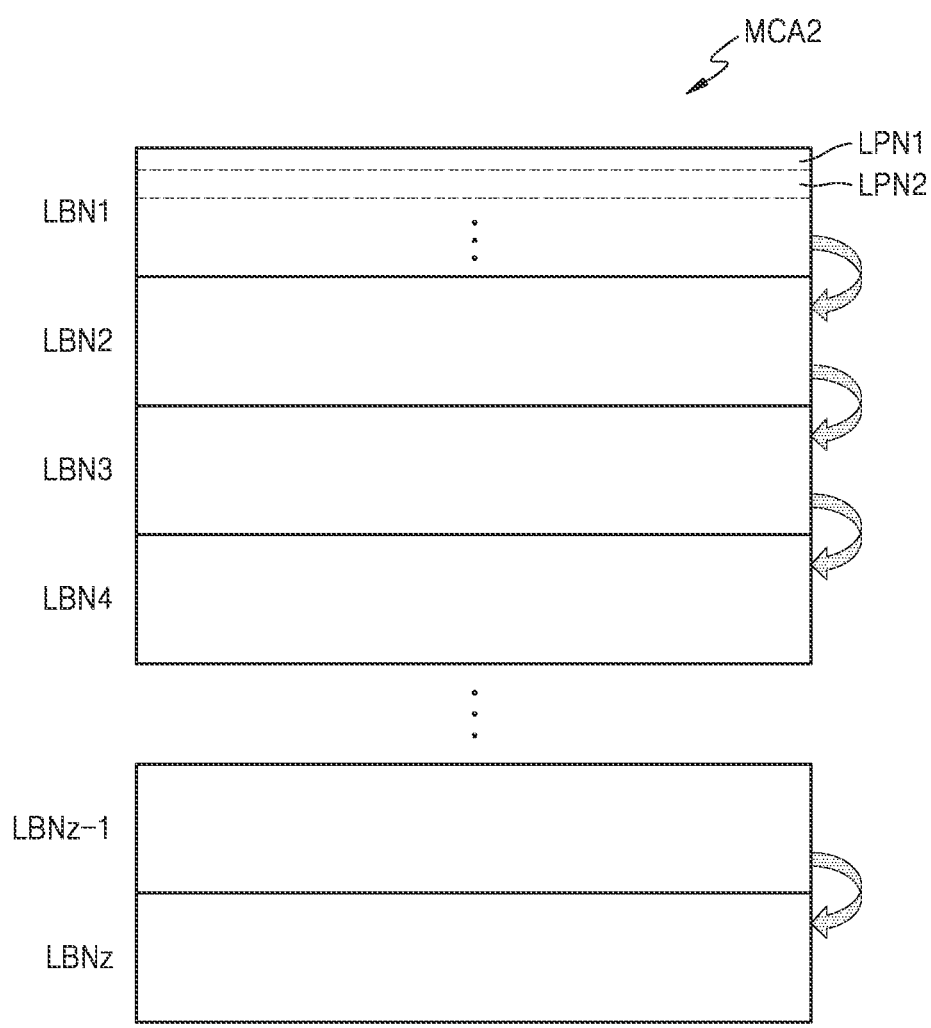
FIG. 19 shows an example of a background read operation according to another embodiment.

FIG. 19 shows an example of a background read operation according to another embodiment.

Referring to FIGS. 1 and 19 together, a memory cell array MCA2 may include first to $z^{th}$ logical blocks LBN1 to LBNz, and may be an example of the memory cell array 121 of FIG. 8. According to an embodiment, a background read operation may be periodically performed on the first to $z^{th}$ logical blocks LBN1 to LBNz according to a logical address. Such a background read operation may be referred to as a "background media scan (BMS)."

The storage controller 110 may periodically perform a background read operation on the first to $z^{th}$ logical blocks LBN1 to LBNz according to a logical address. In an embodiment, an execution order of the background read operation may be changed according to deterioration information or the like. For example, a background read operation may be sequentially performed on all logical pages LPN1 and LPN2 included in the first logical block LBN1, and then a background read operation may be sequentially performed on all logical pages included in the second logical block LBN2. According to an embodiment, the storage device 100 may selectively perform a patrol read operation and a BMS operation.

Figure 20:
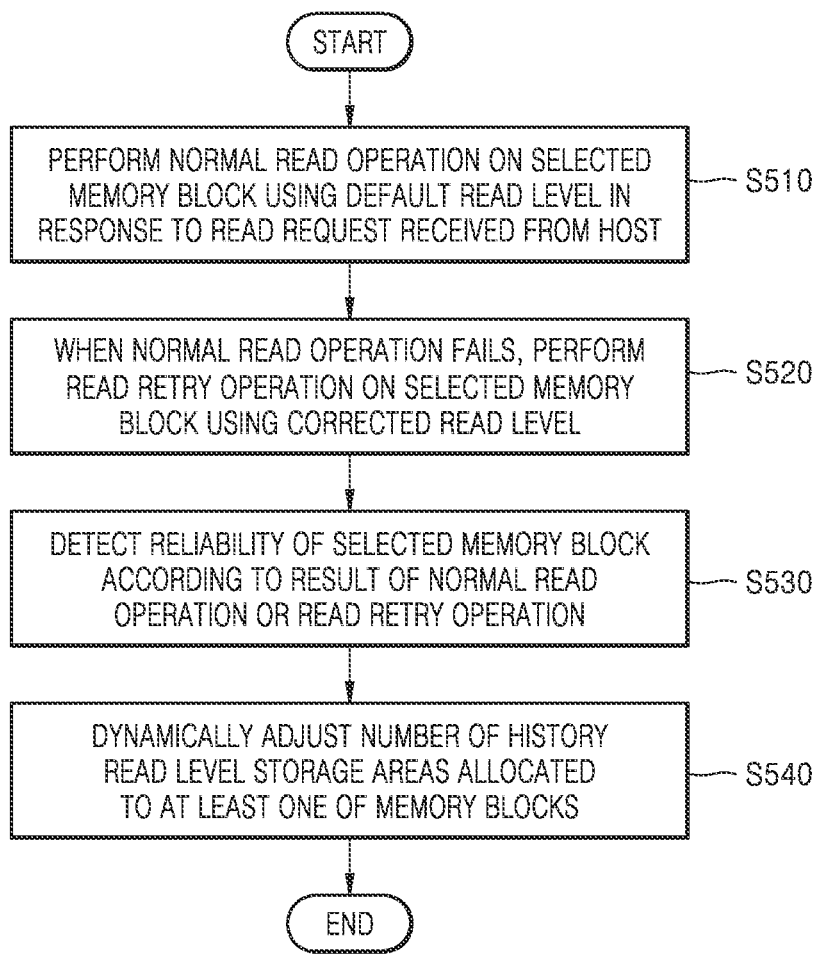
FIG. 20 is a flowchart of a method of dynamically controlling a history buffer according to an embodiment.

FIG. 20 is a flowchart of a method of dynamically controlling a history buffer, according to an embodiment.

Referring to FIG. 20, in operation S510, the storage controller 110 may perform a normal read operation on a selected memory block by using a default read level in response to a read request received from the host 200. In operation S520, when the normal read operation fails, the storage controller 110 may perform a read retry operation on the selected memory block by using the corrected read level. In operation S530, the storage controller 110 may detect the reliability of the selected memory block according to a result of the normal read operation or the read retry operation. For example, when normal read operation or read retry operation of the memory block fails, it may be determined that the reliability of the memory block is relatively low. In an embodiment, a reliability of a memory block on which the normal read operation and the read retry operation fails is lower than a reliability of a memory block on which the normal read operation fails but the read retry operation succeeds. In operation S540, the storage controller 110 may dynamically adjust the number of history read level storage areas allocated to at least one of the memory blocks BLKs. For example, the number of history read level storage areas allocated to memory block with relatively low reliability (for example, memory block on which normal read operation has failed, or memory block on which read retry operation has failed) may be increased.

Figure 21:
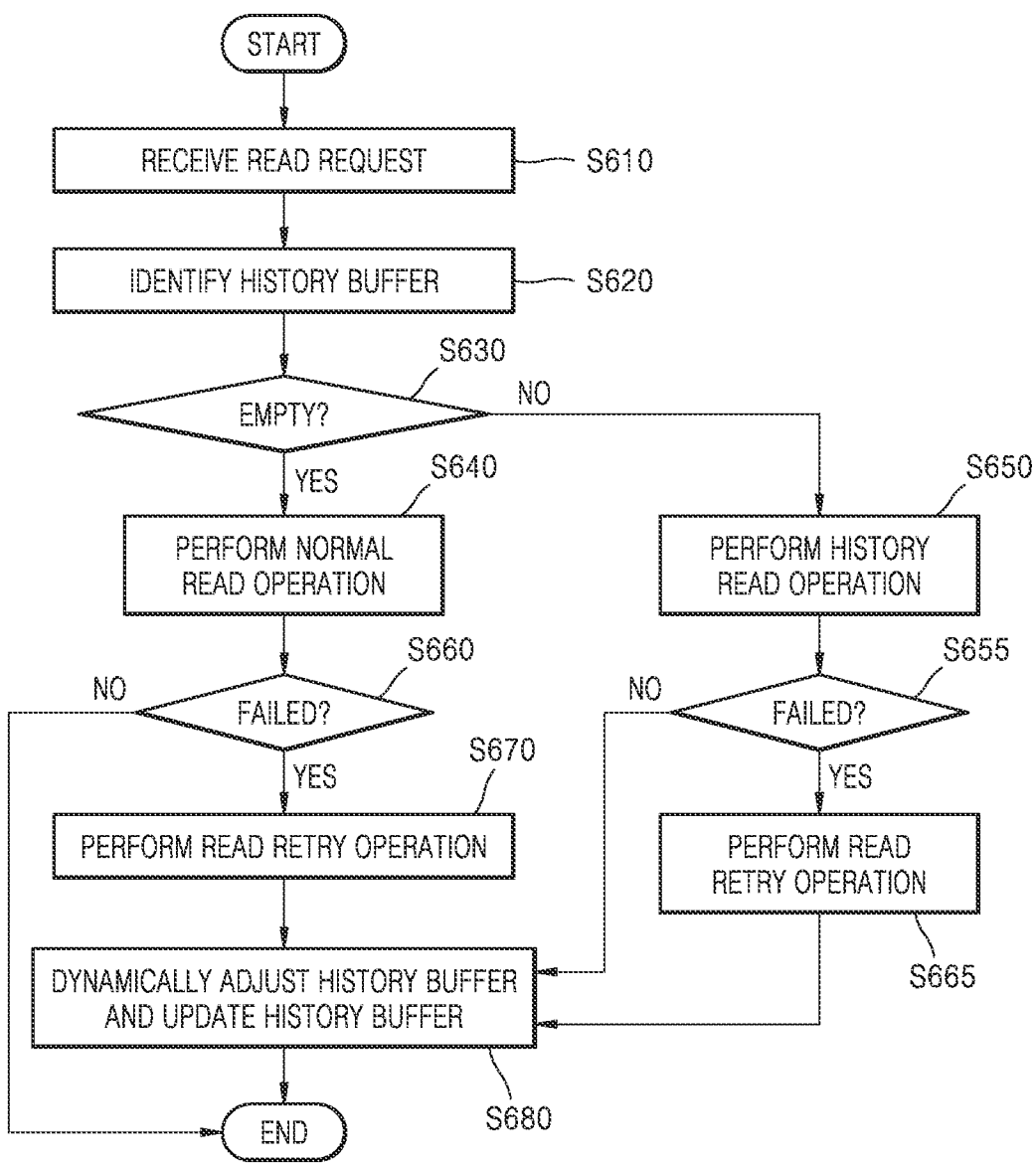
FIG. 21 is a flowchart illustrating the method of dynamically controlling the history buffer of FIG. 20 in more detail, according to an embodiment.

FIG. 21 is a flowchart illustrating the method of dynamically controlling the history buffer of FIG. 20 in more detail, according to an embodiment.

Referring to FIG. 21, the method may include a method of performing a host read operation in the storage device when a read request is received from the host. For example, the operating method according to the embodiment of FIG. 21 may be performed in a time series in the storage device 100 of FIG. 1. The descriptions provided above with reference to FIGS. 1 to 14 may also be applied to the embodiment of FIG. 21.

In operation S610, the storage controller 110 may receive a read request. For example, the storage controller 110 may receive the read request and an address from the host 200. In operation S620, the storage controller 110 may identify the history buffer HB. For example, the storage controller 110 may identify the history buffer HB to determine whether a history read level corresponding to an address exists. In operation S630, the storage controller 110 may determine whether the history buffer HB is empty. As a result of the determination, when the history buffer HB is empty (S630, YES), operation S640 is performed; otherwise, when the history buffer HG is not empty (S630, NO), operation S650 is performed.

In operation S640, the storage controller 110 may perform a normal read operation. For example, the storage controller 110 may perform the normal read operation by using a default read level. In operation S650, the storage controller 110 may perform a history read operation. For example, the storage controller 110 may perform the history read operation by using a history read level. In operation S660, the storage controller 110 may determine whether the normal read operation fails. As a result of the determination, when the normal read operation fails (S660, YES), operation S670 may be performed; otherwise, when the normal read operation does not fail (i.e., succeeds) (S660, NO), the method may end. In operation S670, the storage controller 110 may perform a read retry operation. For example, the storage controller 110 may perform a read retry operation on the corresponding memory block by using a corrected read level different from a default read level or a corrected read level different from the history read level. In operation S680, the storage controller 110 may dynamically adjust the history buffer HB and update the history buffer HB. The storage device 100 may update the history buffer HB by storing the corrected read level as the history read level for the corresponding memory block.

In operation S655, the storage controller 110 may determine whether the history read operation fails. As a result of the determination, when the history read operation does not fail (i.e., succeeds) (S665, NO), operation S680 may be performed and the storage controller 110 may dynamically adjust the history buffer HB by decreasing the number of storage spaces S-AR allocated and may update the history buffer HB. Otherwise, when the history read operation fails (S655, YES), operation S665 may be performed. In operation S665, the storage controller 110 may perform a read retry operation. For example, the storage controller 110 may perform a read retry operation on the corresponding memory block by using a corrected read level different from the history read level. In operation S680, the storage controller 110 may dynamically adjust the history buffer HB and update the history buffer HB. The storage device 100 may update the history buffer HB by storing the corrected read level as the history read level for the corresponding memory block.

Figure 22:
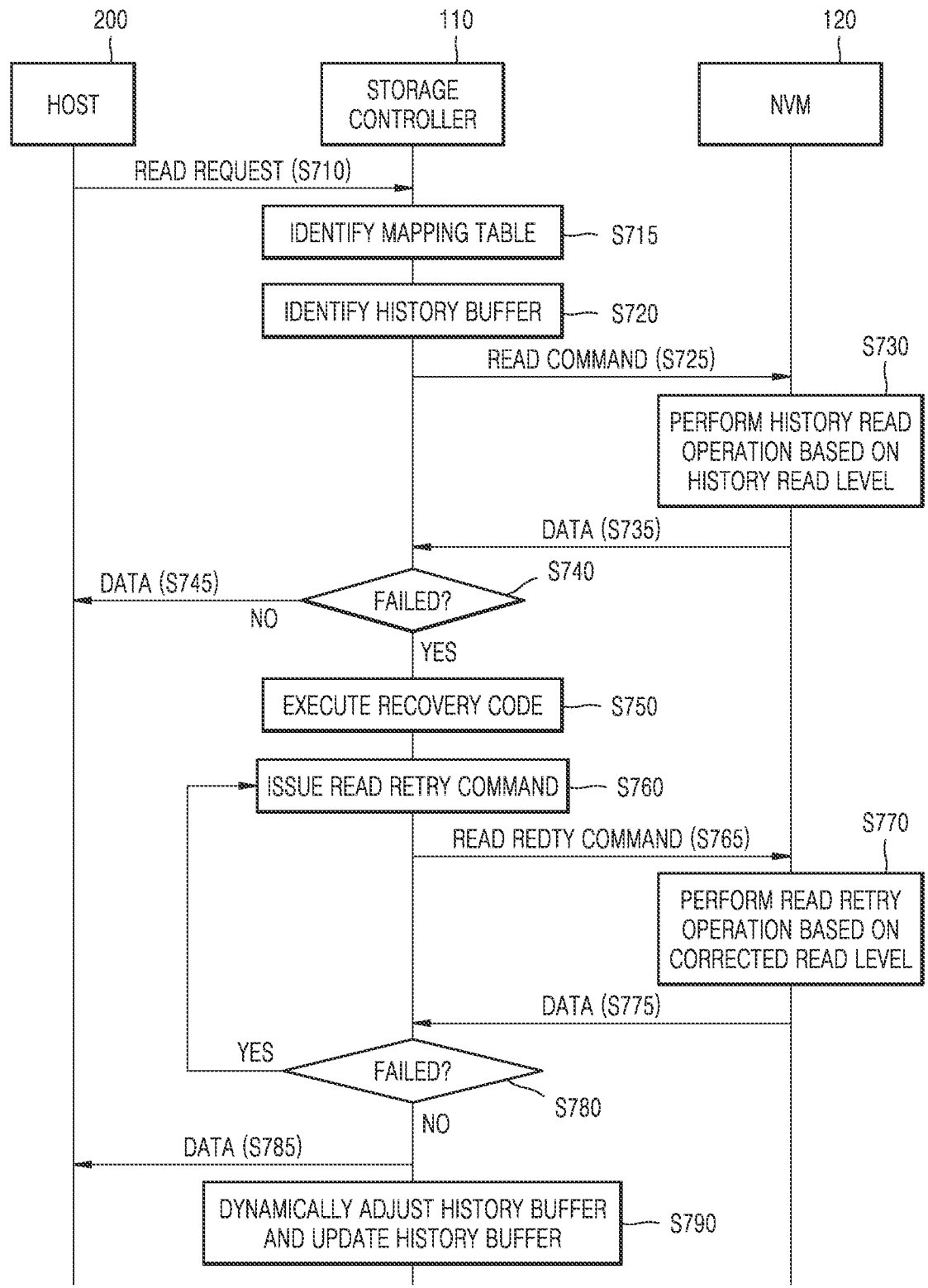
FIG. 22 is a flowchart of an operation among a host, a storage controller, and a non-volatile memory according to the method of FIG. 20, according to an embodiment.

FIG. 22 is a flowchart of an operation among a host, a storage controller, and non-volatile memory according to the method of FIG. 20, according to an embodiment.

Referring to FIG. 22, in operation S710, the host 200 may transmit a read request and an address to the storage controller 110. In this case, the address transmitted from the host 200 may be a logical address. In operation S715, the storage controller 110 may identify a mapping table. For example, the storage controller 110 may identify a physical address corresponding to the received logical address. In operation S720, the storage controller 110 may identify a history buffer HB. For example, the storage controller 110 may identify the history buffer HB to determine whether a history read level corresponding to a memory block including the identified physical address exists.

In operation S725, the storage controller 110 may transmit a read command to the NVM 120. In operation S730, the NVM 120 may perform a history read operation by using a history read level. In operation S735, the NVM 120 may transmit data to the storage controller 110. In operation S740, the storage controller 110 may determine whether the history read operation fails, based on the data received in S735. As a result of the determination, when the history read operation fails (S740, YES), operation S750 is performed. When the read operation does not fail (S740, NO), in operation S745, the data received in S735 may be transmitted from the storage controller 110 to the host 200.

In operation S750, the storage controller 110 may execute recovery code. For example, the storage controller 110 may determine the corrected read level by executing the recovery code. In operation S760, the storage controller 110 may issue a read retry command. In operation S765, the storage controller 110 may transmit the read retry command to the NVM 120. In operation S770, the NVM 120 may perform a read retry operation by using the corrected read level. In operation S775, the NVM 120 may transmit data to the storage controller 110.

In operation S780, the storage controller 110 may determine whether the read retry operation fails, based on the data received in S775. As a result of the determination, when the read retry operation does not fail (S780, NO), operation S785 is performed. When the read retry operation fails (S780, YES), operation S760 may be performed again. IN some embodiments, when the read retry operation fails (S780, YES) operation S750 may be performed again followed by operation S760 as described above. For example, recovery code different from that of the previous operation S750 may be executed, and thus the corrected read level may be changed. In operation S785, the storage controller 110 may transmit the data received in S775 to the host 200. In operation S790, the storage controller 110 may update the history buffer by storing the corrected read level in the read history table. In an embodiment, operation S790 may be performed first, and then operation S785 may be performed. In an embodiment, operations S785 and S790 may be performed substantially simultaneously. In an embodiment, the present operating method may further include receiving a next read request and a next address from the host, and performing a host read operation on the next address by using the updated history buffer that was updated in operation S790.

Figure 23:
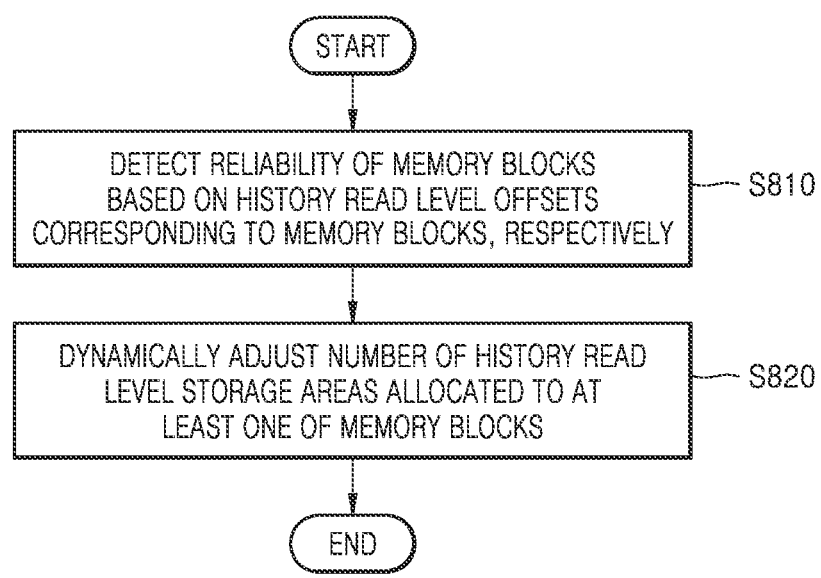
FIG. 23 is a flowchart of a method of dynamically controlling a history buffer according to an embodiment.

FIG. 23 is a flowchart of a method of dynamically controlling a history buffer, according to an embodiment.

Referring to FIG. 23, in operation S810, the storage controller 110 may detect the reliability of the memory blocks BLKs based on history read level offsets corresponding to the memory blocks BLKs, respectively. In operation S820, the storage controller 110 may dynamically adjust the number of history read level storage areas allocated to at least one of the memory blocks BLKs.

In an embodiment, the storage controller 110 may detect the reliability of the memory blocks BLKs based on a reference range defined according to a first reference value and a second reference value. The first reference value may be less than the second reference value. For example, the storage controller 110 may determine a memory block having a history read level offset stored in the history buffer HB less than the first reference value as a good block. For example, the storage controller 110 may determine a memory block having a history read level offset stored in the history buffer HB greater than or equal to the first reference value and less than or equal to the second reference value as a middle block. For example, the storage controller 110 may determine a memory block having a history read level offset stored in the history buffer HB greater than the second reference value as a bad block. As described above, the storage controller 110 may determine that the larger the history read level offset, the greater the distribution movement, and the storage controller 110 may be determined that the reliability of the memory block is considerably low because deterioration of the memory block increases.

In an embodiment, the storage controller 110 may include a machine learning module and estimate reliability of the memory blocks BLKs by using the machine learning module. For example, the machine learning module may detect at least one bad block from among the memory blocks BLKs based on a history read level or a history read level offset stored in the history buffer HB. For example, the machine learning module may estimate the reliability of the memory blocks BLKs based on read data from the memory blocks BLKs and/or the result of the ECC operation on the read data.

Figure 24:
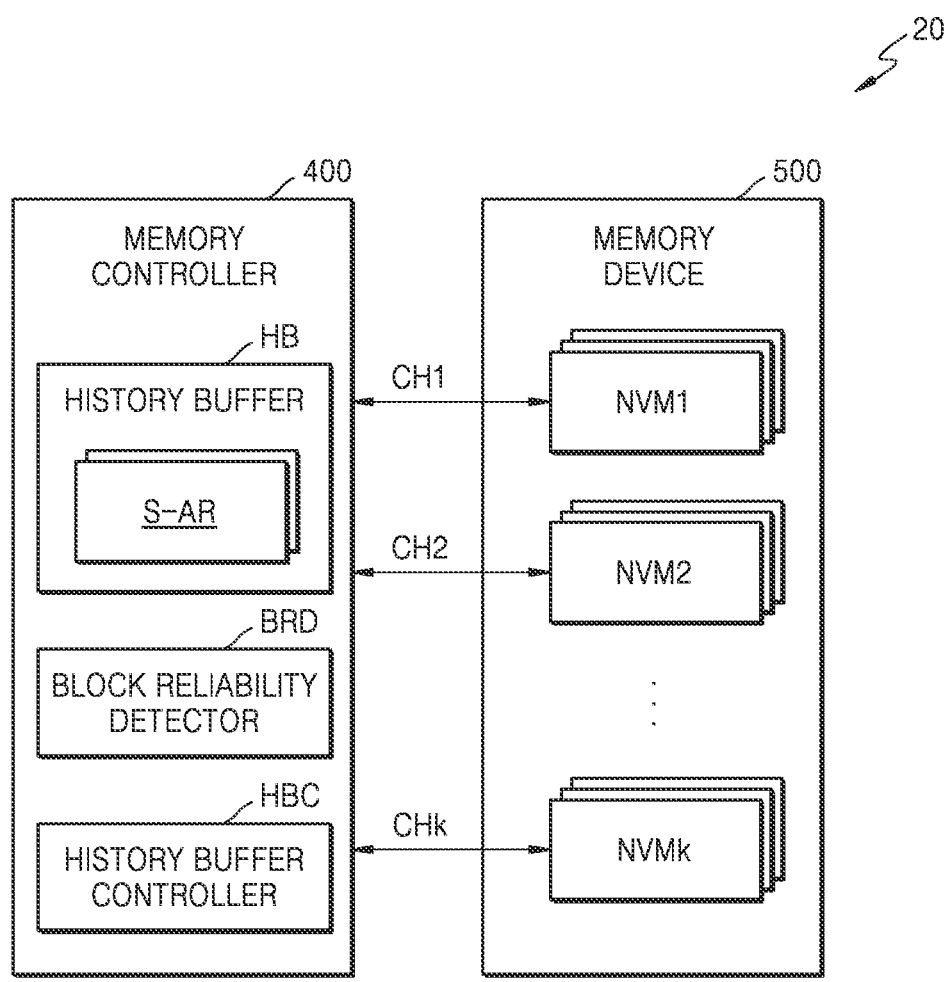
FIG. 24 is a block diagram of a storage device according to an embodiment.

FIG. 24 is a block diagram of a storage device 20 according to an embodiment.

Referring to FIG. 24, the storage device 20 may include a memory controller 400 and a memory device 500. The storage device 20 may support a plurality of channels CH1 to CHk, and the memory device 500 and the memory controller 400 may be connected through the plurality of channels CH1 to CHk (where k is a positive integer). The memory controller 400 may control an overall operation of the memory device 500. The memory controller 400 may transmit signals to the channels CH1 to CHk to control each of non-volatile memory devices NVM1, NVM2, and NVMk connected to the channels CH1 to CHk.

The memory device 500 may include a plurality of non-volatile memory devices NVM1, NVM2, and NVMk. For example, at least one of the plurality of non-volatile memory devices NVM1, NVM2, and NVMk may correspond to the NVM 120 of FIG. 1. The non-volatile memory devices NVM1 may be connected to the first channel CH1, the non-volatile memory devices NVM2 may be connected to the second channel CH2, and the non-volatile memory devices NVMk may be connected to the kth channel CHk. In an example embodiment, each of the non-volatile memory devices NVM1, NVM2, and NVMk may be implemented as a memory unit capable of operating according to an individual command from the memory controller 400. For example, each of the non-volatile memory devices NVM1, NVM2, and NVMk may be implemented as a chip or a die, but embodiments are not limited thereto.

The memory controller 400 may transmit/receive signals to and from the memory device 500 through the plurality of channels CH1 to CHk. For example, the memory controller 400 may transmit commands, addresses, and data to the memory device 500 or receive data from the memory device 500 through the channels CH1 to CHk. The memory controller 400 may select one of the non-volatile memory devices NVM1, NVM2, and NVMk connected to the corresponding channel through each channel, and transmit/receive signals to and from the selected non-volatile memory device. In addition, the memory controller 400 may transmit/receive signals to and from the memory device 500 in parallel through different channels. For example, the memory controller 400 may transmit a command to the memory device 500 through the second channel CH2 while transmitting a command to the memory device 500 through the first channel CH1.

The memory controller 400 may include the history buffer HB, the block reliability detector BRD, and the history buffer controller HBC, and the history buffer HB may include the plurality of history read level storage areas S-AR. The history buffer HB, the block reliability detector BRD, and the history buffer controller HBC in FIG. 24 may correspond to the history buffer HB, the block reliability detector BRD, and the history buffer controller HBC illustrated in FIG. 1, and may be implemented substantially similarly. Accordingly, the embodiments described above with reference to FIGS. 1 to 23 may be applied to the embodiment of FIG. 24.

Figure 25:
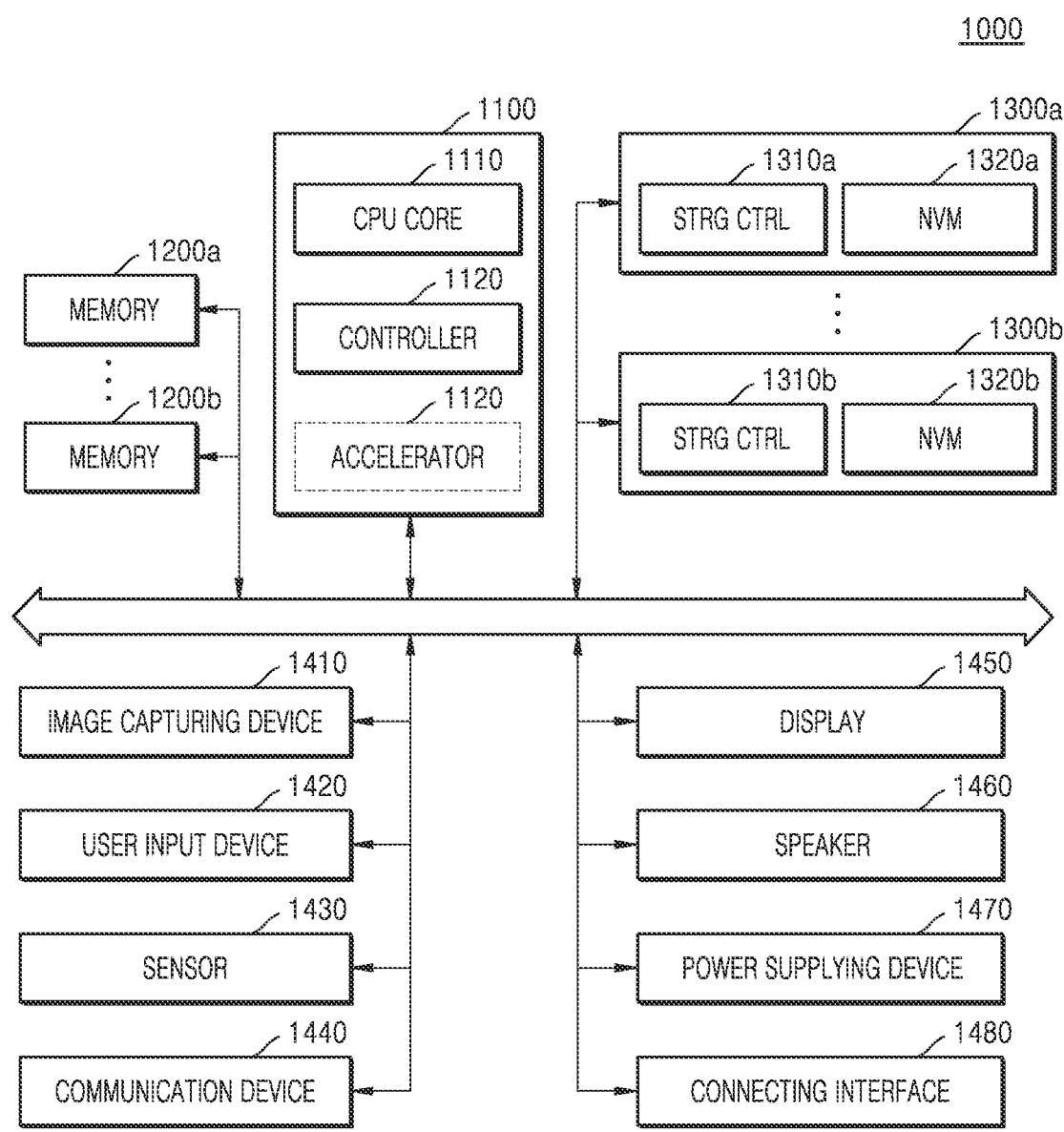
FIG. 25 is a block diagram of an example of a system to which a storage device is applied, according to an embodiment.

FIG. 25 is a diagram of a system 1000 to which a storage device is applied, according to an embodiment. The system 1000 of FIG. 25 may be a mobile system, such as a portable communication terminal (e.g., a mobile phone), a smartphone, a tablet personal computer (PC), a wearable device, a healthcare device, or an Internet of things (JOT) device, or the like. However, the system 1000 of FIG. 25 is not necessarily limited to a mobile system and may be a PC, a laptop computer, a server, a media player, or an automotive device (e.g., a navigation device), etc.

Referring to FIG. 25, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an AP.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or an NVMe, is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

While various embodiments have been particularly shown and described with reference to the drawings, it will be understood that various changes in form and details may be made therein without departing from the spirit and scope of the following claims.

What is claimed is:

1. A storage device comprising:
   a non-volatile memory including a plurality of memory blocks; and
   a storage controller comprising a history buffer including a plurality of history read level storage areas corresponding to the plurality of memory blocks, the storage controller being configured to dynamically adjust a number of the plurality of history read level storage areas allocated to at least one of the plurality of memory blocks based on reliabilities of the plurality of memory blocks during runtime of the storage device,
   wherein the storage controller is configured to increase a number of history read level storage areas allocated to a first memory block among the plurality of memory blocks that has a relatively low reliability with respect to the reliabilities of remaining ones of the plurality of memory blocks.

2. The storage device of claim 1, wherein at least one of the plurality of memory blocks has an N-stack structure in which N stacks are stacked, where N is a positive integer of 2 or more.

3. The storage device of claim 1, wherein a number of history read level storage areas included in the history buffer is fixed, and
   a number of history read level storage areas allocated to each of a portion of the plurality of memory blocks is variable.

4. The storage device of claim 1, wherein the storage controller is further configured to reduce a number of history read level storage areas allocated to a second memory block among the plurality of memory blocks that has a relatively high reliability with respect to the reliabilities of remaining ones of the plurality of memory blocks.

5. The storage device of claim 4, wherein the storage controller is further configured to allocate a first history read level storage area allocated to the second memory block, to the first memory block.

6. The storage device of claim 4, wherein the storage controller is further configured to perform a read operation on the second memory block by using a default read level.

7. The storage device of claim 1, wherein the storage controller further comprises:
   a block reliability detector configured to detect the reliabilities of the plurality of memory blocks; and
   a history buffer controller configured to dynamically control the history buffer based on the reliabilities.

8. The storage device of claim 1, wherein the storage controller is further configured to perform a background read operation on the plurality of memory blocks by using a default read level, without receiving a read request from a host, and detect the reliabilities of the plurality of memory blocks according to a result of the background read operation.

9. The storage device of claim 8, wherein the storage controller is further configured to determine that a reliability of a third memory block in which the background read operation has failed from among the plurality of memory blocks is relatively low, and increase a number of history read level storage areas allocated to the third memory block.

10. The storage device of claim 9, wherein the storage controller is further configured to perform a read retry operation on the third memory block by using a corrected read level, and, when the read retry operation is successful, store the corrected read level in the history buffer as a history read level of the third memory block.

11. The storage device of claim 1, wherein the storage controller is further configured to:
   perform a normal read operation on a selected memory block from among the plurality of memory blocks by using a default read level, based on a read request received from a host,
   when the normal read operation has failed, perform a read retry operation on the selected memory block by using a corrected read level, and
   detect a reliability of the selected memory block according to a result of the normal read operation or the read retry operation.

12. The storage device of claim 11, wherein the storage controller is further configured to determine that the reliability of the selected memory block is relatively low, when the normal read operation for the selected memory block has failed, and increase a number of history read level storage areas allocated to the selected memory block.

13. The storage device of claim 1, wherein the storage controller is further configured to detect the reliabilities of the plurality of memory blocks based on a plurality of history read level offsets corresponding to the plurality of memory blocks, respectively.

14. The storage device of claim 13, wherein the storage controller is further configured to determine that a memory block among the plurality of memory blocks that has a history read level offset equal to or less than a threshold value is a memory block having relatively high reliability, and determine that a memory block among the plurality of memory blocks that has a history read level offset greater than the threshold value is a memory block having the relatively low reliability.

15. The storage device of claim 13, wherein the storage controller is further configured to estimate the reliabilities of the plurality of memory blocks from the plurality of history read level offsets by using a machine learning module.

16. An operating method of a storage controller comprising a history buffer, the operating method comprising:
 allocating a plurality of history read level storage areas included in the history buffer to a plurality of memory blocks included in a non-volatile memory, respectively; and
 performing a history buffer control operation for dynamically adjusting a number of history read level storage areas allocated to at least one of the plurality of memory blocks, based on reliabilities of the plurality of memory blocks,
 wherein the history buffer control operation comprises:
 recovering a history read level storage area allocated to a first memory block among the plurality of memory blocks, when a reliability of the first memory block is greater than a first threshold value; and
 allocating an additional history read level storage area to the first memory block, when the reliability of the first memory block is equal to or less than a second threshold value, the second threshold value being less than the first threshold value.

17. The operating method of claim 16, wherein the history buffer control operation further comprises:
 performing a background read operation on the plurality of memory blocks by using a default read level, without receiving a read request from a host; and
 detecting the reliabilities of the plurality of memory blocks according to a result of the background read operation; and
 dynamically adjusting the number of history read level storage areas allocated to the at least one of the plurality of memory blocks, based on the reliabilities of the plurality of memory blocks.

18. The operating method of claim 16, wherein the history buffer control operation further comprises:
 performing a normal read operation on a selected memory block from among the plurality of memory blocks by using a default read level, based on a read request received from a host;
 when the normal read operation has failed, performing a read retry operation on the selected memory block by using a corrected read level;
 detecting a reliability of the selected memory block according to a result of the normal read operation or the read retry operation; and
 dynamically adjusting the number of history read level storage areas allocated to the at least one of the plurality of memory blocks, based on the reliabilities of the plurality of memory blocks.

19. The operating method of claim 16, wherein the history buffer control operation further comprises:
 detecting the reliabilities of the plurality of memory blocks based on a plurality of history read level offsets corresponding to the plurality of memory blocks, respectively; and
 dynamically adjusting the number of history read level storage areas allocated to the at least one of the plurality of memory blocks, based on the reliabilities of the plurality of memory blocks.

20. A storage controller configured to control a non-volatile memory, the storage controller comprising:
 a host interface configured to communicate with a host;
 a non-volatile memory interface configured to communicate with the non-volatile memory;
 a history buffer including a plurality of history read level storage areas corresponding to a plurality of memory blocks included in the non-volatile memory;
 a block reliability detector configured to detect reliabilities of the plurality of memory blocks; and
 a history buffer controller configured to dynamically adjust a number of history read level storage areas allocated to at least one of the plurality of memory blocks based on the reliabilities.

* * * * *